US006926921B2

(12) United States Patent
Stasiak et al.

(10) Patent No.: US 6,926,921 B2
(45) Date of Patent: Aug. 9, 2005

(54) IMPRINT LITHOGRAPHY FOR SUPERCONDUCTOR DEVICES

(75) Inventors: James Stasiak, Lebanon, OR (US); Pavel Kornilovich, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/430,125

(22) Filed: May 5, 2003

(65) Prior Publication Data

US 2005/0123674 A1    Jun. 9, 2005

(51) Int. Cl.[7] ............................. B05D 5/12; H01L 39/22
(52) U.S. Cl. ........................ 427/62; 29/599; 505/329; 505/410; 505/471; 505/702
(58) Field of Search ..................... 427/62, 355, 369; 29/599; 204/192.24; 505/329, 410, 470, 505/702

(56) References Cited

U.S. PATENT DOCUMENTS

| | | | |
|---|---|---|---|
| 4,421,785 A * | 12/1983 | Kroger | 427/63 |
| 5,593,918 A * | 1/1997 | Rostoker et al. | 505/330 |
| 5,801,393 A | 9/1998 | Sung et al. | |
| 5,939,730 A | 8/1999 | Durand et al. | |
| 6,157,044 A * | 12/2000 | Nakanishi et al. | 257/33 |
| 6,294,450 B1 | 9/2001 | Chen et al. | |
| 6,365,059 B1 | 4/2002 | Pechenik | |
| 6,375,870 B1 * | 4/2002 | Visovsky et al. | 264/1.31 |
| 6,407,443 B2 | 6/2002 | Chen et al. | |
| 6,449,620 B1 | 9/2002 | Draper et al. | |
| 6,476,413 B1 | 11/2002 | Jia et al. | |
| 6,482,742 B1 | 11/2002 | Chou | |
| 6,690,162 B1 | 2/2004 | Schopohl et al. | |
| 2002/0120630 A1 | 8/2002 | Christianson et al. | |
| 2002/0132482 A1 | 9/2002 | Chou | |
| 2002/0179897 A1 | 12/2002 | Eriksson et al. | |
| 2002/0190249 A1 | 12/2002 | Williams et al. | |
| 2003/0203649 A1 * | 10/2003 | Carter | 438/780 |
| 2003/0219992 A1 | 11/2003 | Schaper | |

FOREIGN PATENT DOCUMENTS

| | | |
|---|---|---|
| EP | 0428357 A2 | 5/1991 |
| WO | WO01/25805 A1 | 4/2001 |
| WO | WO02/08835 A2 | 1/2002 |

OTHER PUBLICATIONS

Alexandre Blais et al., "Operation of universal gates in an solid-state quantum computer based on clean Josephson junctions between d-wave superconductors," Physical Review A. vol. 61, The American Physical Society 2000, pp. 042308-1-4.

Rutger Vrijen et al., "Electron Spin Resonance Transistors for Quantum Computing in Silicon-Germanium Heterostructures," quant-ph/9905096, vol. 2, Jun. 1999, pp. 1-10.

Yuriy Makhlin et al., "Josephson-junction qubits with controlled couplings," Nature Magazine, vol. 398, Mar. 1999, pp. 305-307.

(Continued)

*Primary Examiner*—Brian K. Talbot

(57) ABSTRACT

One aspect of this disclosure relates to a method of building a superconductor device on a substrate, comprising depositing an imprint layer on at least a portion of the substrate. The imprint layer is imprinted to provide an imprinted portion of the imprint layer and a non-imprinted portion of the imprint layer. A superconductor layer is deposited on at least a portion of the imprinted portion of the imprint layer.

44 Claims, 15 Drawing Sheets

Following Imprint Process, Pattern and Form Second Superconductor Electrodes

OTHER PUBLICATIONS

Jonathan R. Friedman et al., "Detection of a Schrodinger's Cat State in an rf-SQUID," arXiv:cond-mat/0004293 v2, Apr. 2000, pp. 1-7.

T.P. Orlando et al. "Flux-based Superconducting Qubits for Quantum Computation," Jul. 2001, pp. 1-6.

K.D. Irwin et al., "Time-Division SQUID Multiplexers," 9th Workshop on Low Temperature Detectors, Jul. 2001, 5 pages.

Alexey V. Ustinov, "Quantum Computing Using Superconductors," 11 pages.

Ustinov, Alexey V.; "Quantum Computing Using Superconductors" Physikalisches Institut, Universitat Erlangen-Numberg 2001. Found online Nov. 29, 2004.

Kroemer, Herbert; "Spectulations about future directions" Journal of Crystal Growth; North-Holland Publishing co.; Amsterdam, NL; vol. 251, No. 1-4; Apr. 2003.

Marrian & Tennant; "Nanofabrication"; Journal of Vacuum Sciences and Technology A.; Vacuum, Surfaces and Films, American Institute of Physics; New York, NY; vol. 21, No. 5; Sep. 2003.

International Search Report for Intl. Application No. PCT/US2004/013532; Hewlett-Packard Development Co. Apr. 29, 2004.

* cited by examiner

Starting Substrate

Apply Imprint Layer

Align Imprint Template

Stamp Imprint Layer

Cool Substrate and Release
Imprint Template

Remove Residual Polymer
(using RIE or equivalent)

Deposit Superconductor Layer 1 Using
Appropriate Deposition

Lift - Off Polymer/Metal Layer Leaving
The Superconductor Electrode

Blanket Deposition of Passivation Insulator Layer

Planarize Passivation Insulator Layer
(using Chemical Mechanical Polishing or
equivalent)

Apply Hard Mask Imprint Layer

Blanket Deposit Hard Mask Metal Using
Appropriate Deposition Process

Lift - Off Hard Mask Imprint Layer
Leaving Hard Mask Metal Behind

Etch Passivation Insualtor Layer
in Tunnel Junction Regions

Remove Hard Mask Metal

Oxidize Exposed Superconductor
Metal to Form Tunnel Barrier

Following Imprint Process, Pattern and
Form Second Superconductor Electrodes

IMPRINT LITHOGRAPHY FOR SUPERCONDUCTOR DEVICES

TECHNICAL FIELD

This invention relates to superconductor devices and circuits, and more particularly to superconductor devices and circuits produced using imprint lithography.

BACKGROUND

Superconductor technology offers considerable promise in a variety of electronic applications based on a nearly infinite conductance that exists in superconductor materials at superconducting temperatures. This promise includes extremely quick electronic switching, transmission of large amounts of data over considerable distances, and the reduction in transmission losses over transmission media. Superconductor technology has been applied to form a variety of discrete superconductor devices such as Josephson junctions and superconductor quantum interference devices (SQUIDs).

Prior art superconductor devices and circuits have been fabricated by using a combination of a wide variety of traditional processes such as lithography, optical processes, electron beam lithography, anodization, ploughing, and focused ion beam processes. These fabrication techniques have generally been used to produce discrete superconductor devices. However, such techniques are not capable of repeatably producing a large number of superconductor devices (such as one or more arrays of the superconductor devices) in a reliable and/or cost effective manner.

BRIEF DESCRIPTION OF THE DRAWINGS

The same numbers are used throughout the drawings to reference like features and components.

DETAILED DESCRIPTION

Superconductor devices 50 or superconductor circuits promise significant enhancements in electronic performance. Much of the promise of superconductor technology is associated with the reduced electrical conductivity of the superconductor materials used in these devices and circuits when used at temperatures approaching absolute zero.

Imprint lithography (IL) represents a fabrication technique that can be used to fabricate superconductor devices, superconductor circuits, and arrays of superconductor devices. Recent IL techniques (i.e., nano-imprint lithography) can achieve device geometries down to substantially less than 100 nanometers (nm). Furthermore, as described herein, IL provides a process that can be adapted for high volume manufacturing needs. This disclosure describes the use of IL techniques that are used to fabricate such superconductor devices and circuits as Josephson junctions and superconductor quantum interference devices (SQUIDs).

Additionally, IL techniques can produce arrays of these superconductor devices in a time efficient and cost effective manner. The performance, utility, and cost effectiveness of many superconductor circuits are improved based on the ability to form superconductor devices into multiple arrays. By exploiting the advantages of the IL process, that in one embodiment is performed by the IL tool 100, it becomes possible to manufacture such minute intricate patterns as required by either combinations of individual superconductor devices, superconductor circuits, or dense arrays of superconductor devices and superconductor circuits.

An advantage of the disclosed IL technology involves the capability to fabricate nano-scale, micro-scale, and macro-scale features simultaneously and equally efficiently. IL is an enabling technology that opens up a variety of applications that can make use of nano-scale, meso-scale, macro-scale, and mixed-scale features.

Figure 6:
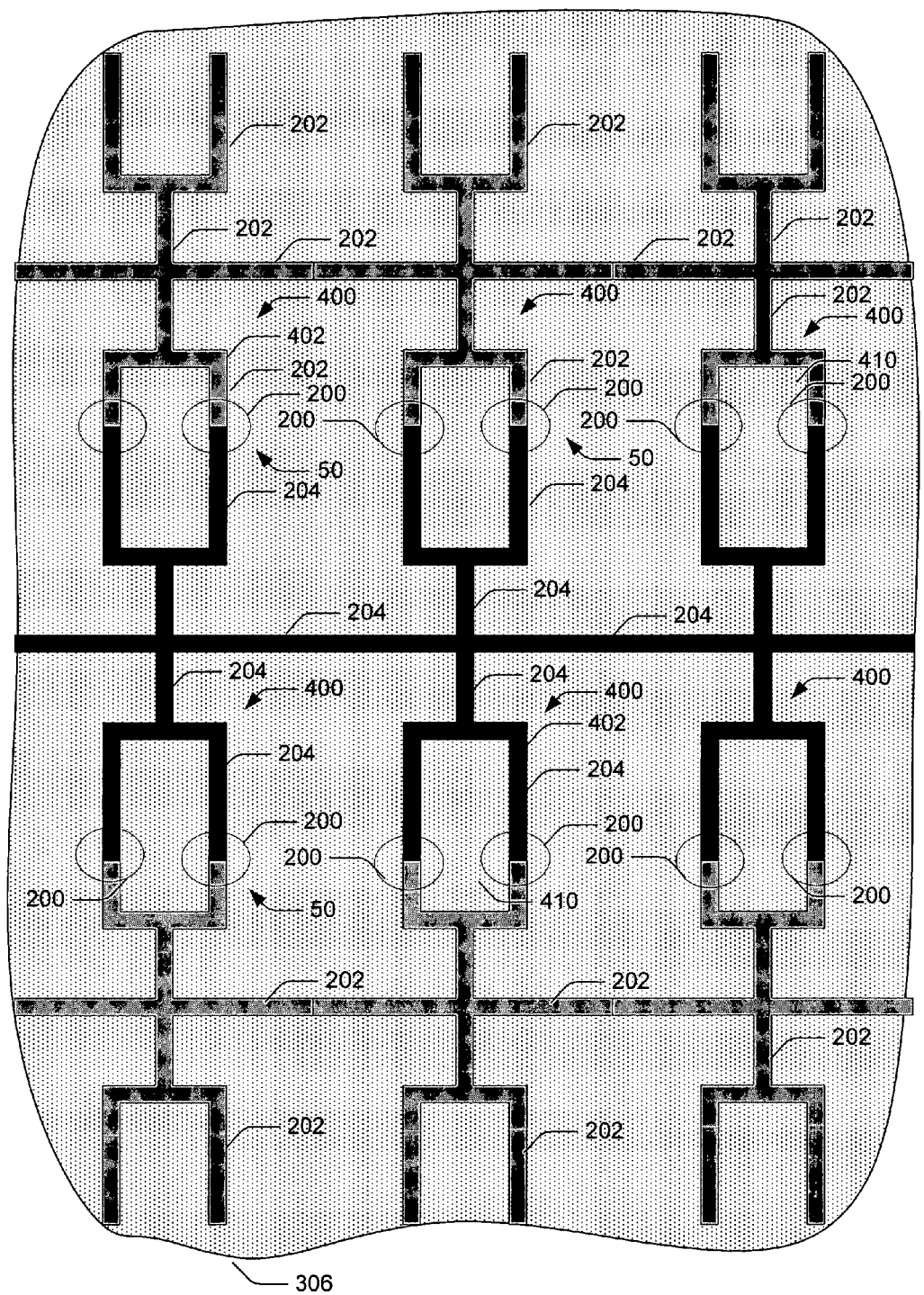
FIG. 6 illustrates one embodiment of an array of superconductor devices as illustrated in FIGS. 5a and 5b including a first superconductor electrode and a second superconductor electrode.

One strength of the disclosed IL technology involves the capability to produce a large number of superconductor devices (e.g., up to hundreds or thousands) that are arranged in a repeatable and non-random order. These superconductor devices can be arranged in an array 700 or, alternatively, in a non-arrayed configuration. Arrays 700 of superconductor devices (as shown in FIGS. 6 and 7) can be produced cost effectively using batch processing techniques as provided by IL.

This disclosure describes the use of inexpensive batch processing to manufacture high-quality superconductor circuits and/or superconductor devices in a highly repeatable fashion. One advantage of IL technology is that different portions of a superconductor device 50 or a superconductor circuit can be manufactured simultaneously with nano-scale, meso-scale, macro-scale, or larger dimensions (or a combination of these dimensions). It is also envisioned that certain portions of a substrate may be fabricated using IL techniques as described herein, while other portions of the substrate are fabricated using other techniques.

Prior art nano-scale and mixed-scale superconductor devices (as well as meso-scale and macro-scale devices) have been used to study fundamental properties of quantum mechanics where they demonstrate great operational promise. Providing a cost-efficient technique to fabricate arrays 700 of these superconductor devices would expand their usage greatly into many different applications.

Additionally, the imprint mold 305 (as shown in side cross-sectional view in FIGS. 8c, 8d, and 8e) of a superconductor device 50 can be made using non-IL techniques, such as e-beam lithography or optical lithography. The imprint template 305 can then be stamped/imprinted in certain embodiments of the IL processing to produce a large number of superconductor devices. Examples of superconductor materials in superconductor devices that can be stamped or imprinted using IL technologies include but are not limited to superconducting metals (e.g., Al, Nb, Pb, and Sn), superconducting alloys, superconducting oxides, organic superconductors, high-temperature superconductors, and other superconducting compounds.

It is also envisioned that certain portions of a substrate may be fabricated using IL techniques as described herein, while other portions of the substrate are fabricated using other techniques. Different embodiments of the substrate include, for example, a semiconductor, a plastic film, a metal film, a glass, a fabric, and a paper. New superconductors materials are being discovered frequently. As such, it is envisioned that any superconductor device 50 that is produced with any superconductor material known presently or discovered in the future is within the intended scope of the present disclosure.

Though this disclosure is directed to superconductor circuits, devices, and processes, it is to be understood that certain superconductor circuits and devices include non-superconductors (e.g., semiconductor, conductor, insulator, or a combination of these or other materials). For large-scale circuits including superconductor portions, for example, certain active regions may be formed from superconductor materials while the supply circuitry is formed from non-superconductor materials. Combinations of non-superconductor devices and superconductor devices are applicable to a variety of uses. As such, within this disclosure, the term "superconductor" circuit or device includes any circuit or device that includes at least a portion of superconductor material.

A superconductor circuit including a non-superconductor portion (e.g. made from certain semiconductors or other non-superconductive materials) is considered a hybrid structure within the scope of this disclosure. In one embodiment, fabrication techniques that are typically applied to semiconductor circuits such as Ultra-Large Scale Integration (ULSI) and/or field effect transistors (FETs) can integrate certain embodiments of superconductor circuits as described in this disclosure to form a hybrid circuit. The hybrid circuit can be formed from one or more superconductor circuits and from one or more non-superconductor materials.

Imprint lithography (IL) as described in this disclosure utilizes stamping or imprinting to produce superconductor circuits with nano-scale dimensioned features. By utilizing the advantages provided by IL, a variety of considerations are addressed. Prior art SQUIDs are typically fabricated using standard IC technology on semiconductor (e.g., silicon) wafers, and then the wafers are diced into individual die. The semiconductor processing can be individual, time-consuming, and expensive to produce a considerable number of the superconductor devices. The ability to produce large quantities of superconductor devices or circuits quickly and cost effectively is possible without relying on those technologies that are inherently designed to perform operations on discrete superconductor devices (i.e., produced using electron beam (e-beam) lithography or focused ion beam (FIB) lithography). Both e-beam and FIB are examples of prior art processes performed on individual devices, which have long process times especially when large areas and/or large number of devices are required. Furthermore, e-beam and FIB lithography tools require facilities that are expensive to purchase and to maintain. IL offers the potential of a lower cost process that can be performed relatively quickly. This disclosure describes a mechanism by which superconductor devices having features as fine as e-beam and FIB lithography can be produced in larger quantities than those prior-art technologies in a batch processing mode.

The improvements provided by the different embodiments of the disclosure result in a variety of benefits including: 1) The ability to mass produce complex nano-scale, meso-scale, macro-scale, and mixed-scale structures cheaply and reproducibly (reduces the need for costly e-beam processing that would otherwise be needed); 2) the ability for imprint lithography to reproduce nano-scale, meso-scale, macro-scale, and mixed-scale features accurately; and 3) the ability for IL to fabricate superconductor devices on non-standard substrates because IL does not produce devices or circuits that rely only on traditional semiconductor substrate materials. IL can also repeatably produce such irregular shapes as curves and coils accurately.

IL provides for fabrication of such superconductor circuits as Josephson junctions, DC SQUIDs 400, and arrays of quantum bits that are deposited on a wide variety of flexible and/or conformal substrates wherein the substrate could be bent to adapt to the application. Alternatively, these substrates 306 can include such traditional semiconductor substrates as silicon, gallium arsenide, silicon-on-insulator, etc. that are typically structurally rigid. Substrates 306 are illustrated in the embodiments of superconductor devices in FIGS. 4 and 6, 8a, 8b, 8c, 8d, 8e, 8f, 8g, 8h, 8i, 8j, 8k, 8l, 8m, 8n, 8o, 8p, and 8q. With superconductor devices (unlike semiconductor devices), the substrate does not necessarily participate in the action of the device.

Superconductor devices and circuits deposited on flexible substrates 306 could be made to, for instance, precisely shape the array grid included in the superconductor circuit around such complex geometries as a human skull, other body portion, or other irregularly shaped object. By fabricating SQUIDs on flexible substrates, it should be possible to more precisely shape the dense sensor arrays in such unusual positions and shapes as around a patient's head, arm, mouth, or other body parts to provide a more thorough detection.

Figure 1:
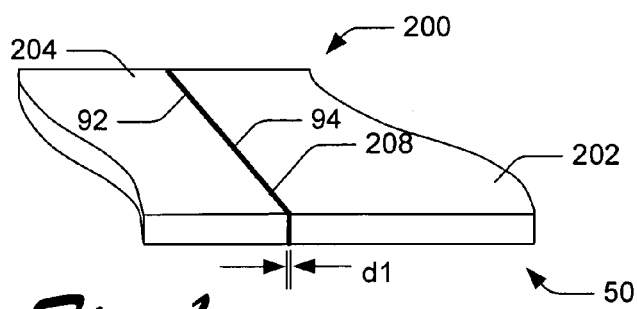
FIG. 1 illustrates a perspective view of one embodiment of a Josephson junction having a butting junction geometry formed at the butting junction of two imprinted electrodes.
Figure 2:
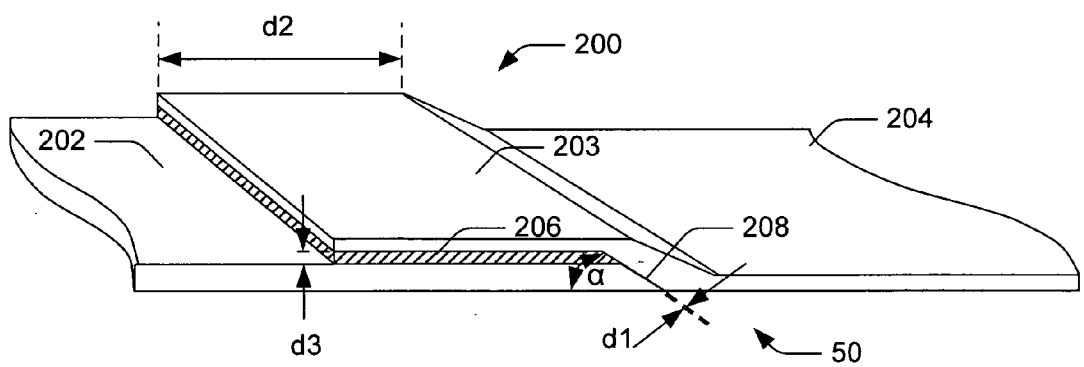
FIG. 2 illustrates a perspective view of one embodiment of a Josephson junction having an edge junction geometry formed at the overlap of two imprinted electrodes.
Figure 3:
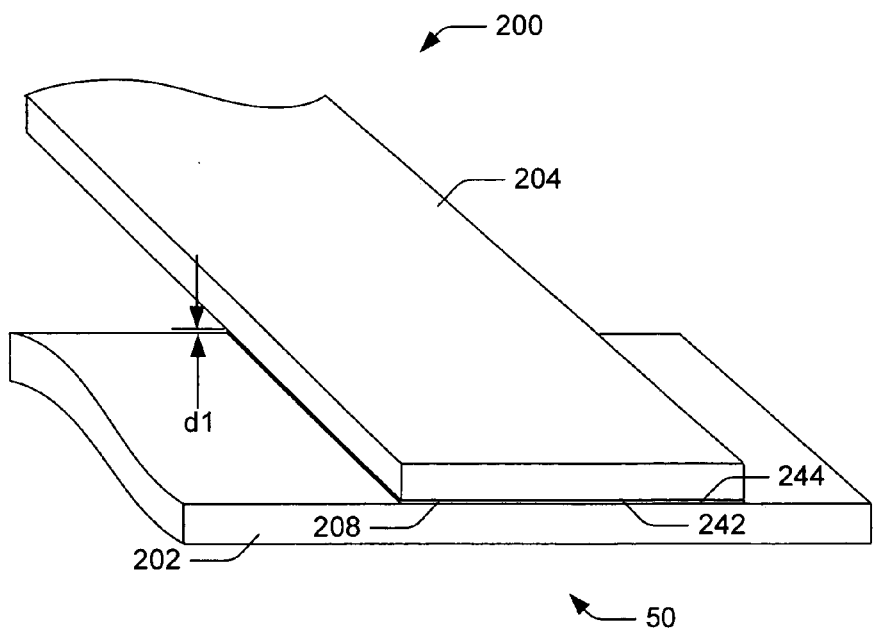
FIG. 3 illustrates a perspective view of another embodiment of the Josephson junction having a planar junction geometry formed at the overlap of two imprinted electrodes.

One embodiment of the superconductor device 50 is a Josephson junction 200. The general structure and operation of multiple embodiments of the Josephson junction 200 that can be fabricated using IL tool 100 are illustrated respectively in FIGS. 1, 2, and 3. The geometries associated with the Josephson junction 200 that are illustrated in FIGS. 1, 2, and 3 are respectively the butt geometry, the edge junction geometry, and the planar geometry. These geometries are intended to be illustrative in nature and not limiting in scope since other Josephson junction geometries can be fabricated using IL fabrication techniques.

The Josephson junctions 200 as shown in FIGS. 1, 2, and 3 include two superconductor electrodes 202, 204 that are positioned in close proximity, and are separated by a tunnel junction 208. One embodiment of the tunnel junction 208 is a thin electrical insulator (e.g., oxide) material that is sufficiently thin to allow tunneling of electrons under certain controllable circumstances. The superconductor electrodes 202, 204, and the remainder of the Josephson junction 200, are fabricated on a substrate (not shown for clarity) as described relative to FIGS. 8a, 8b, 8c, 8d, 8e, 8f, 8g, 8h, 8i, 8j, 8k, 8l, 8m, 8n, 8o, 8p, and 8q.

In one configuration, Jospehson junctions consist of two superconductor metal layers forming the upper superconductor electrode 202 and the lower superconductor electrode 204 separated by a thin insulator (e.g. a metal oxide). Superconductor metals such as niobium and aluminum are typical materials for low temperature devices and metal oxides such as $Nb_2O_5$ and $Al_2O_5$ are typical tunnel junctions 208. Josephson junctions and SQUIDs as described herein have been fabricated using high critical temperature ($T_c$) materials, but the junction geometries can be maintained in many embodiments. The superconductor electrodes 202, 204 can be formed in a variety of configurations including, but not limited to, rectangular or curvilinear forms such as can effectively produce a coil or a serpentine using the IL fabrication techniques as described herein.

In the butt-geometry of Josephson junction 200 shown in FIG. 1, the superconductor electrode 202 is substantially co-planar with the superconductor electrode 204. A face 92 of the superconductor electrode 202 is separated from a face 94 of the superconductor electrode 204 by a dimension d1. The space between the faces 92 and 94 is filled with the electrically insulative material forming the tunnel junction 208. The dimension d1 is selected based on the particular configuration of the Josephson junction 200.

In the edge-junction geometry of the Josephson junction 200 shown in FIG. 2, a portion of the superconductor electrode 204 is coplanar with the superconductor electrode 202. A junction portion 203 of the superconductor electrode 204, however, overlaps and is substantially parallel with the superconductor electrode 202 for a length d2. The "edge junction" geometry of Josephson junction 200 includes the tunnel junction 208 formed with a sloped edge between the superconductor electrodes 202 and 204. By forming the tunnel junction 208 at an angle to the plane of the superconductor electrodes 202, 204, the junction capacitance can be tailored.

An electrical insulator 206 is provided between the junction portion 203 of the superconductor electrodes 202 and 204. The tunnel junction 208 extends at an angle α relative to a common plane of the superconductor electrodes 202 and 204. A thickness d3 between the junction portion 203 of the superconductor electrode 204 and the superconductor electrode 202 is considerably deeper than the depth d1 of the tunnel junction 208. The thickness d3 of the electrical insulator 206 is sufficient to make any tunneling between the tunnel junction 208 of the superconductor electrode 202 and the superconductor electrode 204 negligible. As such, the tunnel junction 208 forms the only region through which electrons can tunnel when the superconductor electrodes are in their superconducting states. The tunnel junction 208 is configured as having the (electrical insulator separation) dimension d1 that is designed so that a certain percentage of the electrons will tunnel through the thin oxide material between the superconductor electrodes 202, 204.

While the electrical insulator 206 and the tunnel junction 208 are shown as being formed from a unitary member in the edge-junction geometry embodiment of Josephson junction 200 shown in FIG. 2, this is illustrative in nature and not limiting in scope. The electrical insulator 206 and the tunnel junction 208 can be formed from different materials, using different fabrication processes, and can be formed at different times.

In the planar geometry of Josephson junction 200 described relative to FIG. 3, the superconductor electrodes 202, 204 form a horizontally extending tunnel junction 208. As such, the superconductor electrode 204 is fabricated above the superconductor electrode 202. The tunnel junction 208 is created between a lower planar surface 242 of the superconductor electrode 204 and an upper planar surface 244 of the superconductor electrode 202. The dimension d1 of the tunnel junction 208 (similar to the embodiments of the Josephson junction 200 shown in FIGS. 1 and 2) determines the operating characteristics of the Josephson junction 200. In certain embodiments of Josephson junctions 200 having a planar geometry, the superconconducting electrodes extend in a direction substantially parallel to each other instead of perpendicular to each other as illustrated in FIG. 3.

The tunnel junction 208 in the different embodiments of Josephson junctions 200 shown in FIGS. 1, 2, and 3 can be fabricated after one of the superconductor electrodes 202 is defined. In all embodiments of Josephson junctions such as shown in FIG. 2, an electrical insulator 206 is formed that electrically insulates the superconductor electrode 204 from the superconductor electrode 202. In certain embodiments of Josephson junctions, a tunnel junction 208 is generally created between the superconductor electrodes 202 and 204 by performing a brief oxidation step on one of the superconductor electrodes 202. The superconductor electrode 204 is then deposited relative to the deposited superconductor electrode 202.

Figure 4:
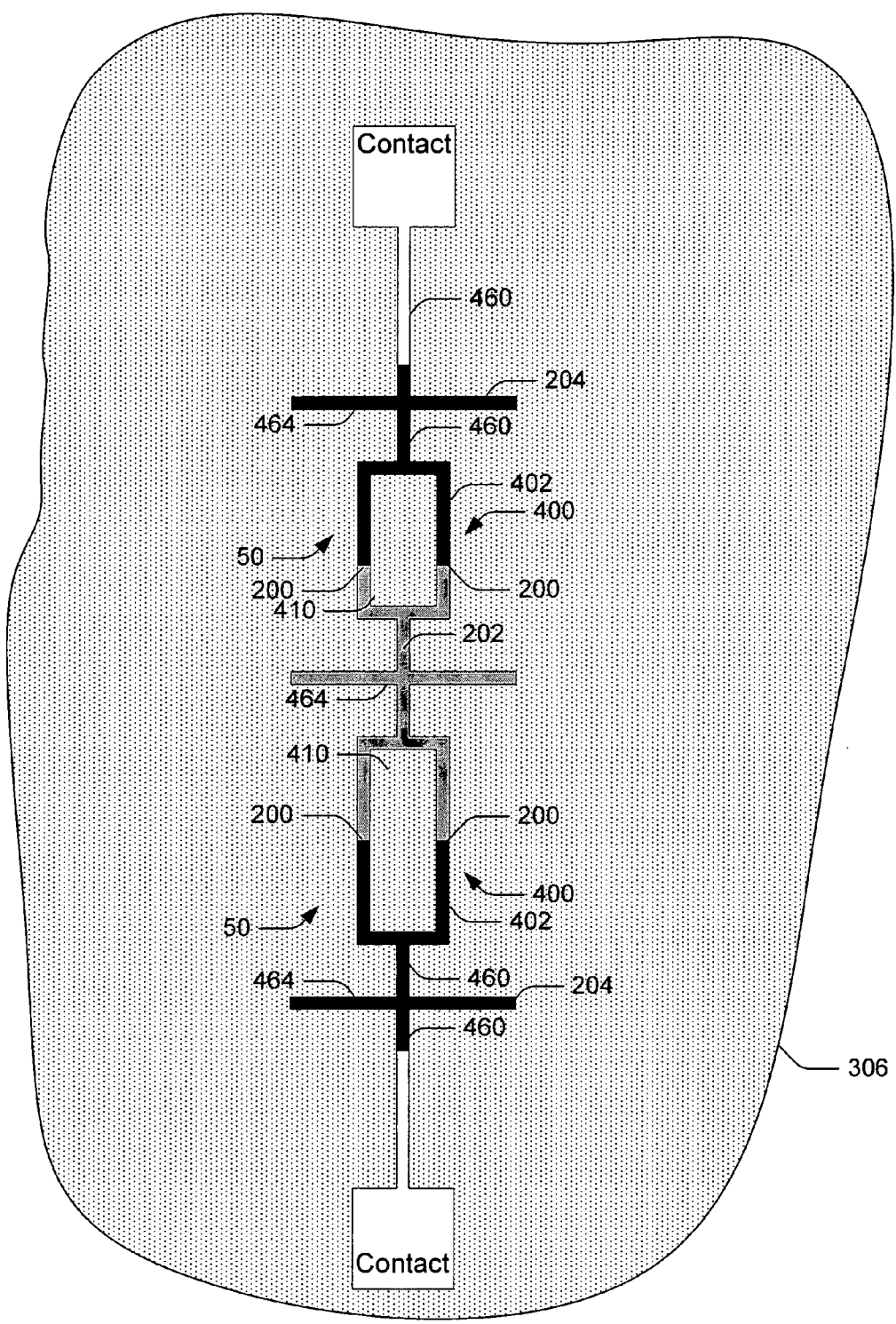
FIG. 4 illustrates a top view of one embodiment of a superconductor device including a direct current (DC) superconductor quantum interference device (SQUID)
Figure 10:
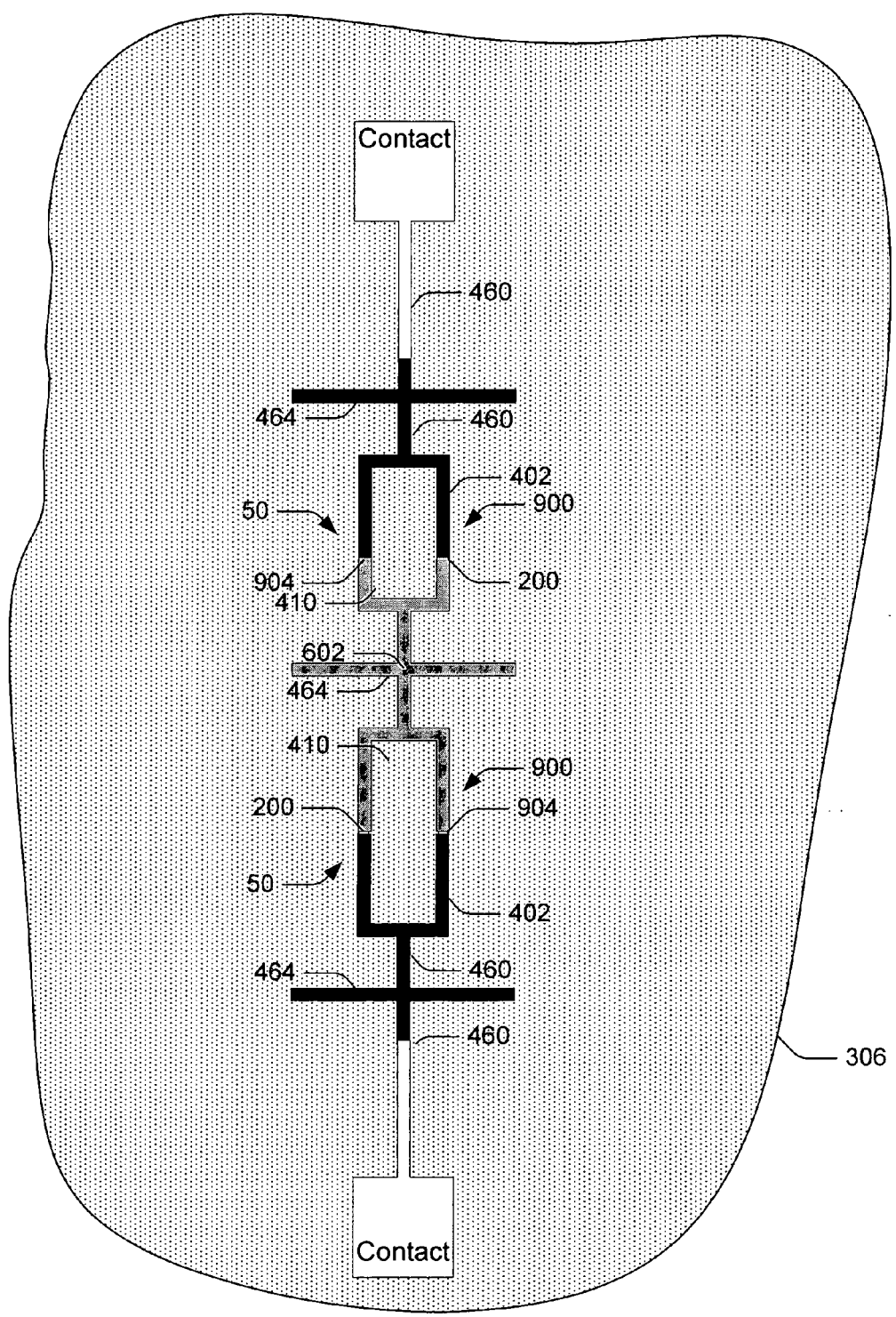
FIG. 10 illustrates a top view of one embodiment of a superconductor device including a radio frequency (RF) superconductor quantum interference device (SQUID)

One embodiment of the superconductor device 50 is a superconductor quantum interference device (SQUID). SQUIDs may be characterized as a direct current (DC) SQUID 400 or a radio frequency (RF) SQUID. Each DC SQUID 400 (as illustrated in FIG. 4) includes a superconductor loop (formed with one or more superconductor materials) having two integrated Josephson junctions 200. Each RF SQUID 900, as illustrated in FIG. 10, includes a superconductor loop (formed with a superconducting material) having only one integrated Josephson junction 200 and one junction 904 that is not of the Josephson junction variety. The remainder of this specification describes each SQUID as being a DC SQUID, even though it is envisioned that the present disclosure applies to RF SQUIDs as well as DC SQUIDs.

Figure 5A:
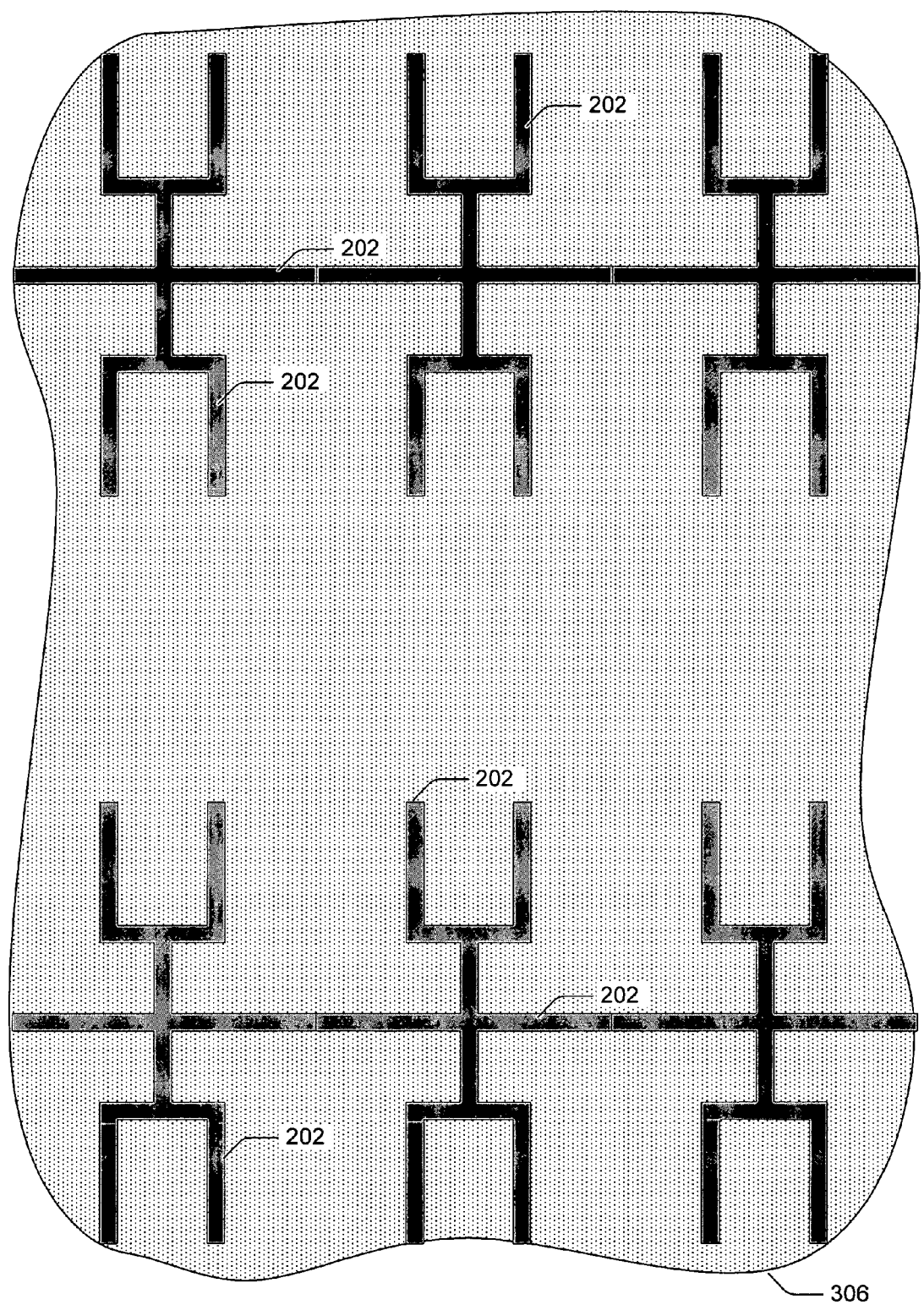
FIG. 5a illustrates a top view of one embodiment of a first imprint level that forms a first superconductor electrode of an exemplary superconducting device such as illustrated in FIG. 4.
Figure 5B:
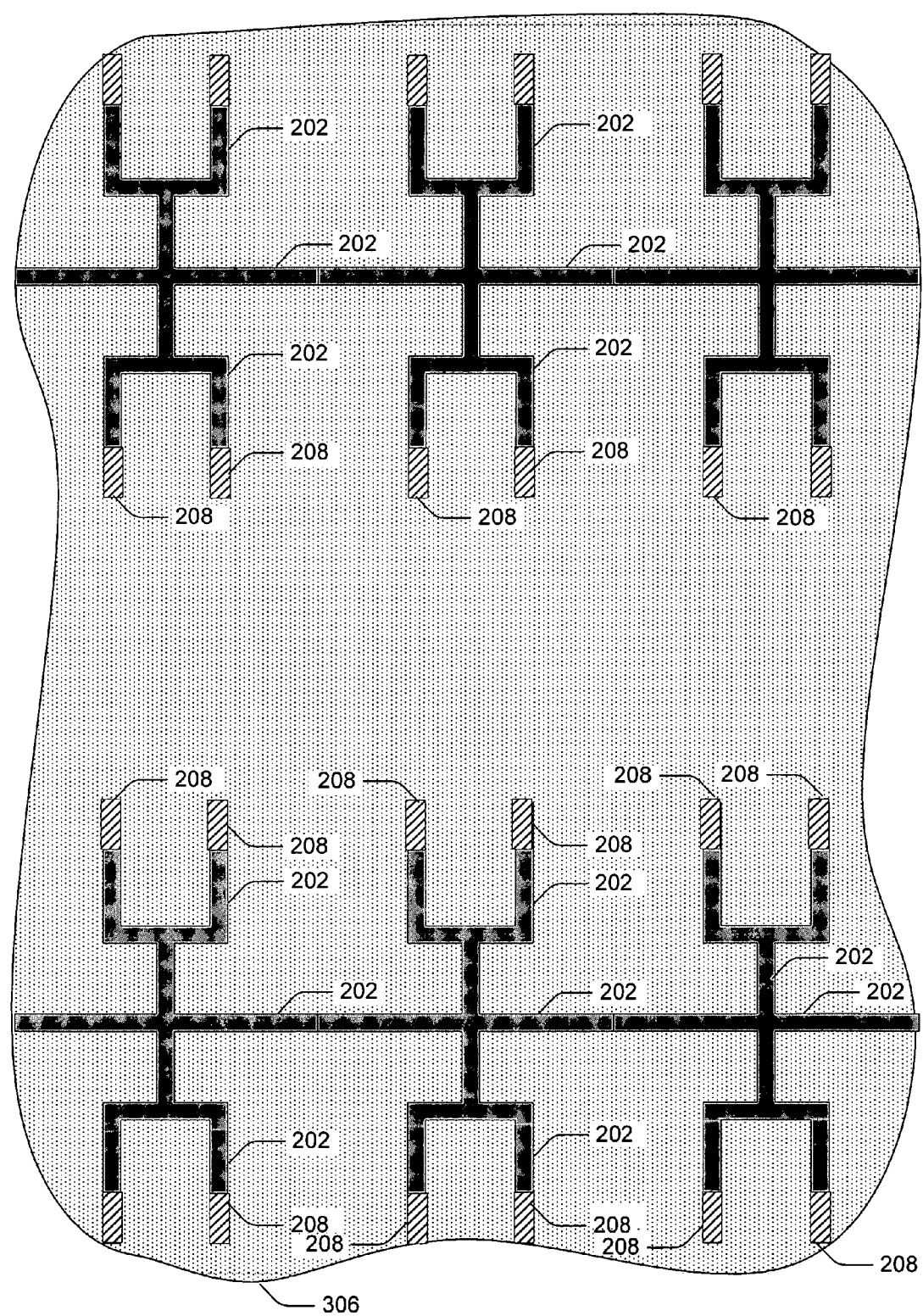
FIG. 5b illustrates the first imprint level of the exemplary superconductor device as illustrated in FIG. 5a in which a first edge of a plurality of tunnel junctions are formed on the first imprint level.

FIGS. 5a, 5b, and 6 illustrate one embodiment of the fabrication of one embodiment of the DC SQUID 400 that is shown in its fabricated state in FIG. 4. In FIG. 5a, the superconductor electrode 202 is deposited on a substrate 306 to form a first imprint level. In FIG. 5b, a planar blanket insulating layer (not shown) is deposited above the first imprint level over the entire substrate. The blanket insulating layer covers the superconductor material forming the superconductor electrode 202. Vias can then formed to extend through the blanket insulating layer (the outline of the blanket insulating layer corresponds roughly to the outline of the tunnel junctions 208) to expose a portion of the superconductor electrode 202. Tunnel junctions 208 are then formed on exposed surfaces of the superconductor electrodes 202 by, in one embodiment, oxidizing the superconductor electrode 202 through the vias.

The embodiment of DC SQUID 400 as shown in FIG. 4 includes a superconductor loop 402 that includes the superconductor electrode 202, the superconductor electrode 204, and a pair of Josephson junctions 200 that connect the superconductor electrodes 202, 204. The superconductor loop 402 is formed from superconductor material. When a varying magnetic field is applied to the interior of the superconductor loop 402 (perpendicular to the sheet of paper within the region delineated by the reference character 410 as shown in FIG. 4), then the resultant electric current flowing within the superconductor loop 402 continually varies as a function of the applied but varying magnetic field applied to the region 410. The rate of varying and maximum value of the resultant electric current depend on the configuration of the DC SQUID 400, the area of the superconductor loop 402, as well as the strength of the magnetic field within the loop. The electric current that flows through the DC SQUID 400 is a highly sensitive indicator of the magnetic field that is applied within the circuit. Since SQUIDs manufactured using this technique described in this disclosure can precisely measure magnetic fields, they are highly applicable to such devices as gradiometers, susceptometers, gravity-wave and antennas. In addition, such SQUIDs are applicable to more complex devices that rely on measuring such magnetic fields as voltmeters, analog-to-digital converters, and multiplexers. The general structure of these electronic circuits is generally well known, and will not be further detailed.

The concepts of superconductor devices as described herein can also be applied to quantum computers. In traditional computation, a binary digital (bit) of information represents one of two possible logical states, namely "1" or "0". Quantum computation involves manipulation of data in the form of quantum bits or "qubits". The qubit represents the basic computational unit of a quantum computer in a similar manner as a binary digit (bit) represents the basic computational unit of the computer.

One embodiment of the quantum computer utilizes arrays of superconducting qubits. Arrays of superconducting qubits can be fabricated by IL as described in this disclosure. Therefore, superconducting quantum computers fabricated by IL are within the scope of the present disclosure.

Certain embodiments of this disclosure provide for the fabrication of superconductor devices and circuits using imprint lithography including, but not limited to, Josephson junctions, DC SQUIDs 400, RF SQUIDs, superconductor magnets, magnetometers, gradiometers, susceptometers, voltmeters, radiofrequency amplifiers, gravity-wave-antennas, analog-to-digital converters, superconductor transmission lines, thin film coils, wires, and other devices.

Certain embodiments of this disclosure also provide for building arrays 700 of superconductor devices (such as Josephson junctions 200 that are illustrated in FIGS. 1, 2, and 3, DC SQUIDs 400 as illustrated in FIG. 4, or RF SQUIDs 900 as illustrated in FIG. 10). The superconductor devices can include both superconductor materials and non-superconductor materials. The superconducting devices can be fabricated as plurality of discrete devices, or arranged in one-dimensional and two-dimensional arrays. Multiple array configurations can be formed across a plurality of layers, in which certain designed portions of the superconductor circuits across the different layers can be formed with one layer above another layer with vias connecting respective portions of the superconductor circuits. Certain embodiments of the superconductor device 50 fabrication utilize IL to produce superconductor device arrays 700 arranged in a cross-bar architecture. The designer may select the particular configuration and associated architecture of the cross-bar architecture to provide a particular operation, since operation of cross-bar arrays is generally known and will not be described except for certain illustrative embodiments.

Figure 7A:
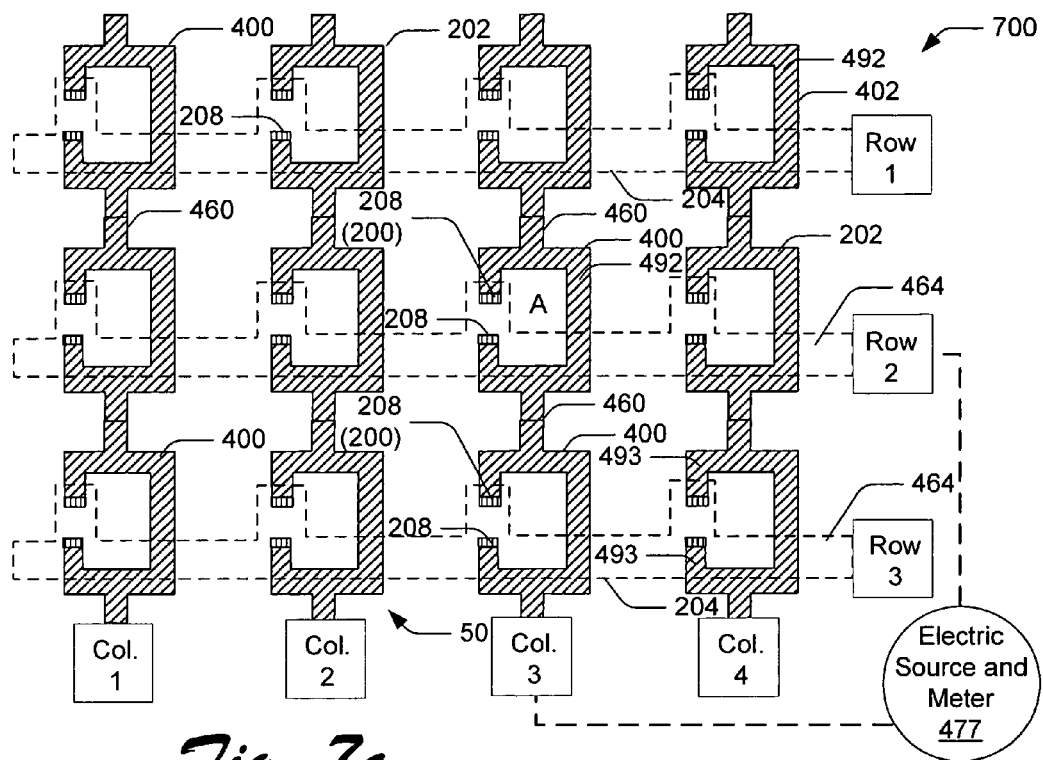
FIGS. 7a and 7b illustrate another embodiment of an array of superconductor devices including a first superconductor electrode and a second superconductor electrode, in FIG. 7a the second superconductor electrode is illustrated in outline while in FIG. 7b the second superconductor electrode is illustrated as solid.
Figure 7B:
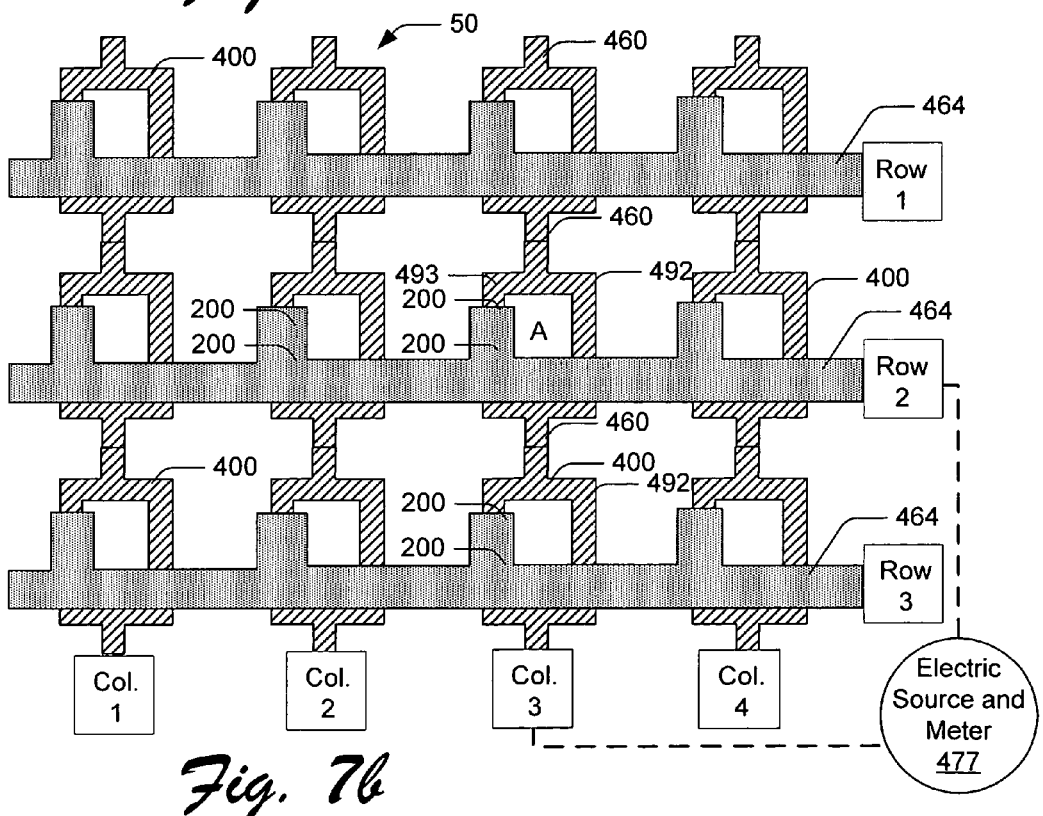

An embodiment including a dense array 700 of Josephson junctions 200 is illustrated in FIG. 6. Another embodiment of an array 700 (that is arranged as in a cross-bar array configuration) is formed from a plurality of DC SQUIDs 400 is illustrated relative to FIGS. 7a and 7b. Each DC SQUID 400 in the array is partially formed from the two superconductor electrodes 202, 204. In FIG. 7a, the superconductor electrode 204 is illustrated in phantom to further illustrate the details of the interface between the superconductor electrode 202 and the superconductor electrode 204. As shown in FIG. 7a, for each DC SQUID 400, a pair of tunnel junctions 208 (as described relative to FIGS. 1, 2, and 3) electrically couple the superconductor electrode 202 to the superconductor electrode 204. An electrical insulator (not shown) typically takes the form of a barrier layer that extends between the superconductor electrodes 202 and 204 at all locations except for at the tunnel junctions 208. Since each SQUID 400 as illustrated in FIG. 7a has a pair of tunnel junctions 208, and each tunnel junction can form a Josephson junction 200 as described relative to FIGS. 1, 2, and 3, each SQUID therefore has two Josephson junctions (and each SQUID is therefore characterized as a DC SQUID). As such, the array 700 includes column conductors 460 and row conductors 464. The column conductors 460 and the row conductors 464 are configured to apply electric potential to a particular DC SQUID 400 in a manner such that the current flow through that DS SQUID can be detected. Since the flow of current through each DC SQUID 400 is a function of the magnetic flux applied to the superconductor loop 402 in that SQUID 400, the array 700 of DC SQUIDs as illustrated in FIGS. 7a and 7b provides a highly sensitive indicator of the magnetic flux applied across the array 700.

Any electrical configuration that can bias a particular superconductor device 50 (or array of superconductor devices), sense the electric state of the biased superconductor device 50 (or array of superconductor devices), and then repeat the biasing and sensing for a plurality of superconductor devices in the array 700 is within the intended scope of the electric source, and meter 477 of the present disclosure. A variety of electric sources, a variety of meters, and a variety of controllers in general are known as being configured to control the operation of application of, and/or the measurement of, electric potential to particular ones of the superconductor devices or circuits. Particulars relating to particular aspects of these electric sources, meters, and/or controllers are generally well known in the electronics field, and will not be further detailes herein.

Each quantum computer includes an array of qubit elements. Certain embodiments of the quantum computer therefore can utilize the arrays 700 (as shown in FIGS. 6 and 7) of qubit elements fabricated from superconductor materials.

Certain embodiments of superconductor devices described in this disclosure can therefore be produced using IL techniques to provide a quantum computer. The article: "Quantum Computing Using Superconductors", Alexey V. Ustinov, Physikalisches Institut, Universität Erlangen-Nürnberg 91058 Erlangen, Germany, provides considerable information on quantum computing.

Figure 11:
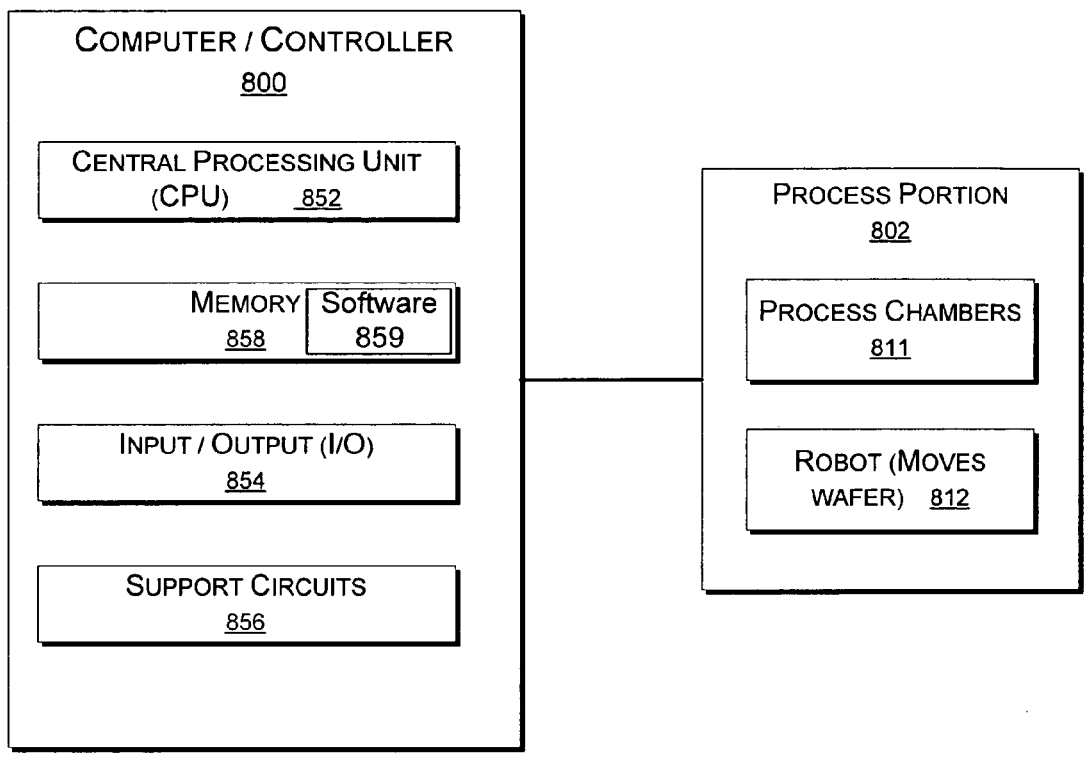
FIG. 11 illustrates an expanded block diagram of one embodiment of a computer that acts as an imprint lithography tool to make superconductor devices using imprint lithography.

One embodiment of the IL process is now described that can be used to produce a variety of superconductor devices such as SQUIDs, Josephson junctions, and qubit elements. Those quantum computers being produced using IL are within the intended scope of the present disclosure. A plurality of relatively simple superconductor devices can be combined with other devices (superconductor and non-superconductor) to produce more complex devices. In this disclosure a two level imprint lithography (IL) process is used to define both the bottom and top superconductor electrodes. A separate imprint step may be used to form the tunnel junction oxide layer. Certain embodiments of the process flow are described relative to FIGS. 8a, 8b, 8c, 8d, 8e, 8f, 8g, 8h, 8i, 8j, 8k, 8l, 8m, 8n, 8o, 8p, and 8q. FIGS. 9a and 9b illustrate one embodiment of a two-level IL process 701 that is performed by the controller or computer 800, as shown in FIG. 11, that is used to fabricate these superconductor devices. As such, the two-level IL process 600 that is illustrated in FIGS. 9a and 9b should be considered in combination with the embodiment of IL process flow described in FIGS. 8a, 8b, 8c, 8d, 8e, 8f, 8g, 8h, 8i, 8j, 8k, 8l, 8m, 8n, 8o, 8p, and 8q.

Figure 8A:
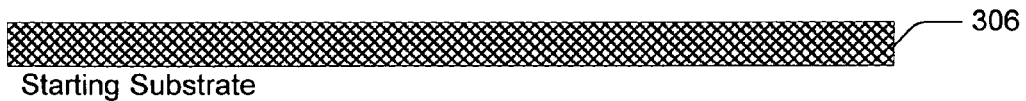
FIGS. 8a, 8b, 8c, 8d, 8e, 8f, 8g, 8h, 8i, 8j, 8k, 8l, 8m, 8n, 8o, 8p, and 8q illustrate an exemplary Imprint Lithograph (IL) method that is used to manufacture a superconductor device.
Figure 9A:
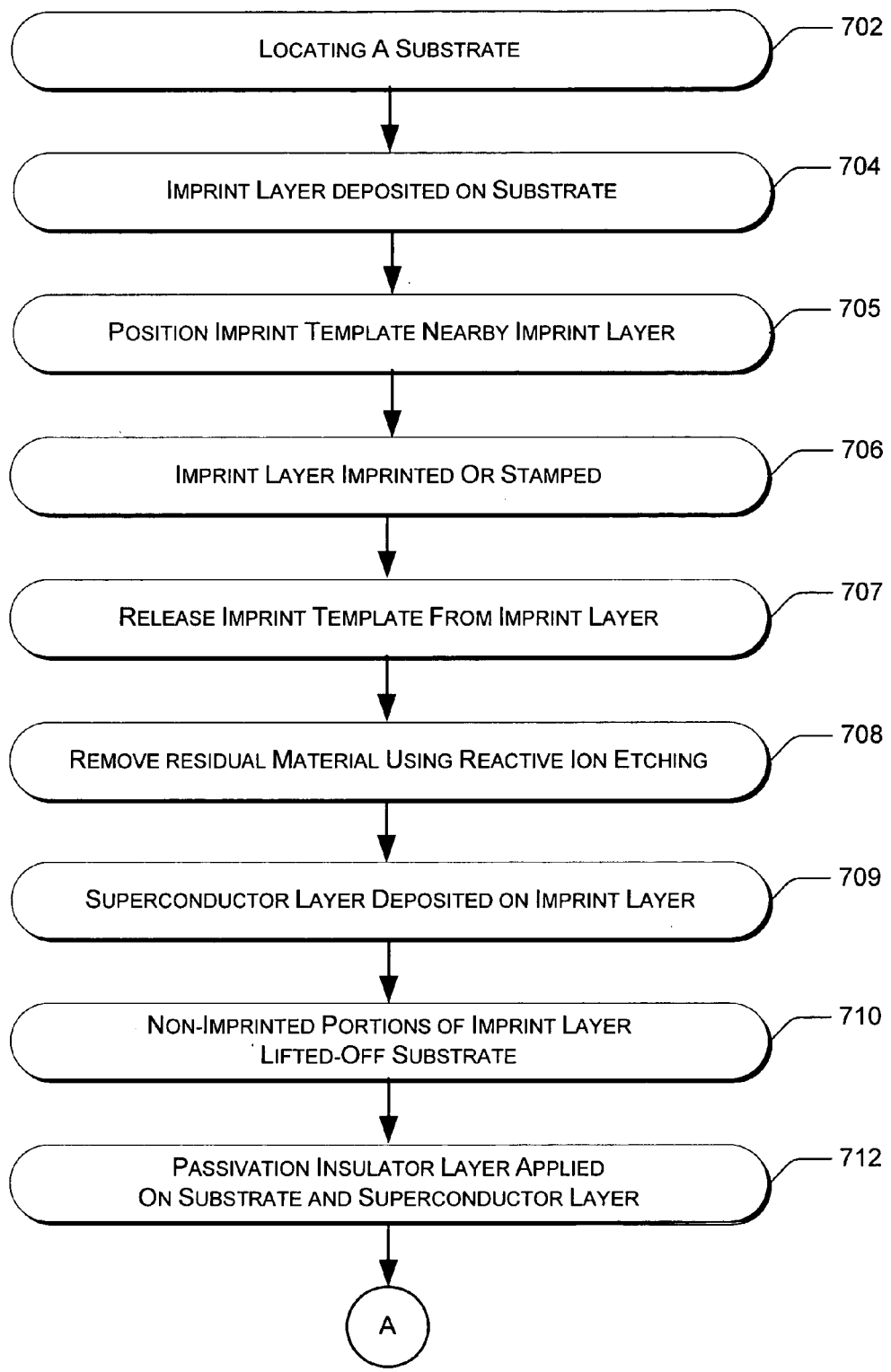
FIGS. 9a and 9b illustrate one embodiment of the IL method of making the superconductor device as shown in FIGS. 8a, 8b, 8c, 8d, 8e, 8f, 8g, 8h, 8i, 8j, 8k, 8l, 8m, 8n, 8o, 8p, and 8q.
Figure 9B:
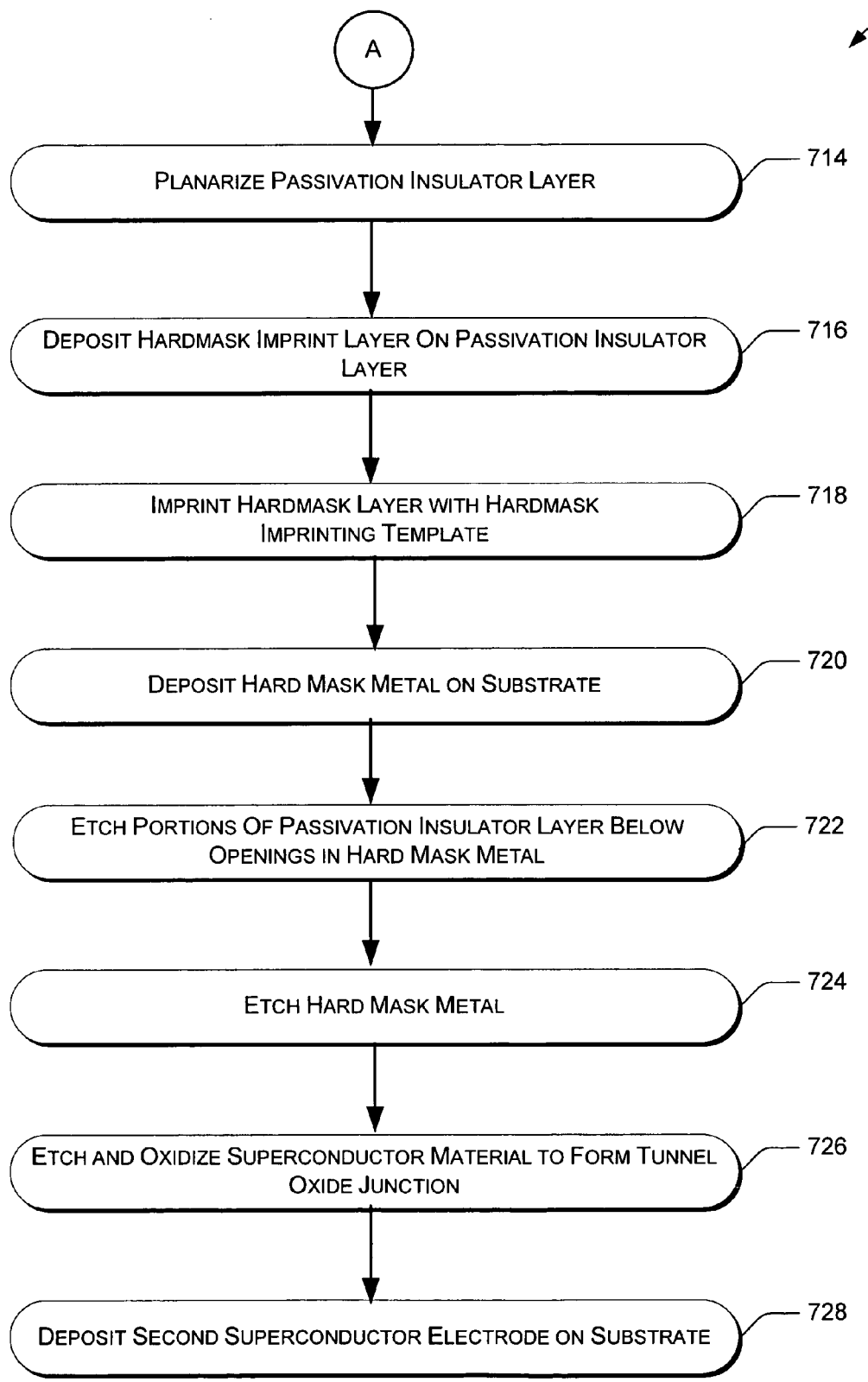

The IL process 701 includes locating the substrate 306 (that is not necessarily silicon as described herein) as illustrated in FIG. 8a on which to fabricate the superconductor device 50 or substrate. This locating the substrate 306 is shown in FIGS. 9a and 9b as 702. One embodiment of the substrate 306 includes a semiconductor such as silicon, gallium arsenide, or silicon-on-insulator (SOI). Another embodiment of the substrate 306 includes a non-semiconductor based substrate that is selected based on the specific properties of the substrate material (e.g., flexibility, dimension, cost, durability, etc.). Examples of flexible substrates 306 include certain plastics, metal foil, paper, and fabric. Examples of rigid substrates include certain plastics, glass, metals, etc. As such, a wide variety of substrates are considered to be within the scope of the present disclosure.

Figure 8B:
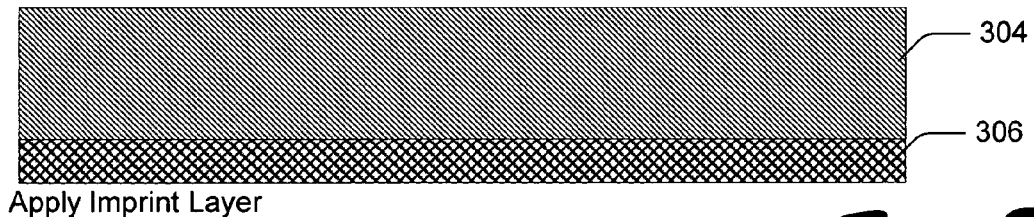

An imprint layer 304 (e.g., typically formed from a polymer) is deposited on the substrate 306 as shown in FIG. 8b. The deposition of the imprint layer 304 on the substrate 306 is referenced as 704 in FIGS. 9a and 9b. The imprint layer 304 is initially deposited as a level sheet using known deposition processes such as chemical vapor deposition (CVD), sputtering, evaporation, spinning, dipping, doctor blading, and physical vapor deposition. Certain embodiments of the imprint layer 304 include a polymer such as poly methyl methacrolate (PMMA). In other embodiments, a non-polymer material may be used as the imprint layer. The imprint layer has to be able to be imprinted for the imprint lithography process to be effective.

Figure 8C:
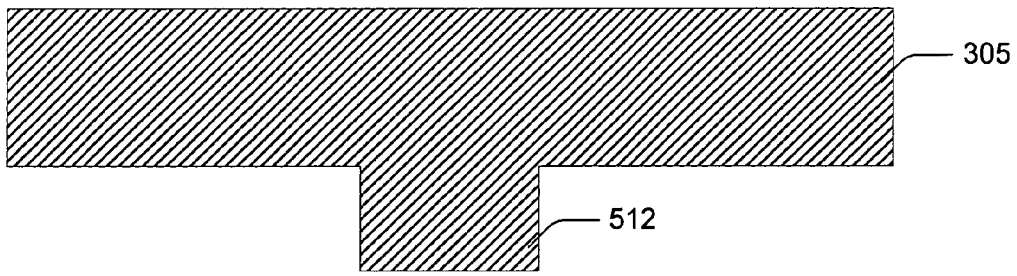

In FIG. 8c, the imprint template 305 that is to perform the stamping or imprinting action in the IL process is located nearby the imprint layer 304 in preparation of the imprinting process. The imprint template 305 includes topographical patterns 512 that extend downward toward the imprint layer 304. This positioning of the imprint template 305 near the imprint layer is 705 in FIGS. 9a and 9b.

Figure 8D:
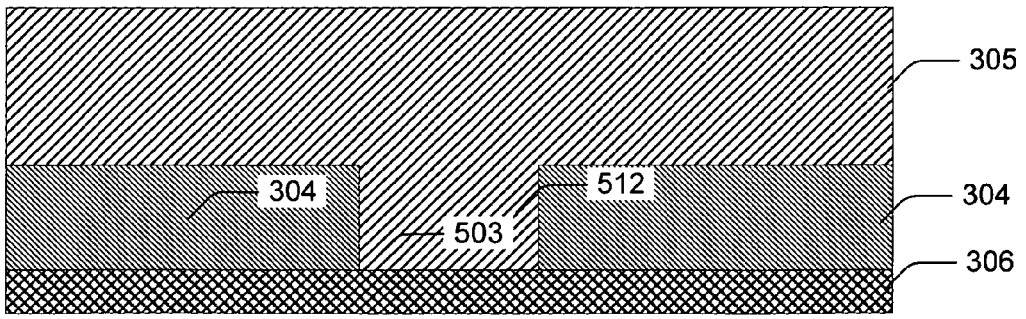

In FIG. 8d (and 706 in FIGS. 9a and 9b), the imprint template 305 is driven into the imprint layer 304 to imprint, or stamp, some of the material of the imprint layer. For imprint lithography, the imprint template 305 is driven downward into the imprint layer 304 such that the topographical patterns 512 form as an inverse pattern of the grooves or trenches as imprint portions 503.

Two embodiments of imprint lithography techniques that are within the intended scope of imprint lithography as described in the present disclosure are "thermal imprint lithography" and "step and flash imprint lithography". In "step and flash" imprint lithography, the imprint layer 304 is selected to have photochemical properties (e.g., a photoresist), and material of the imprint template 305 is selected to be optically transparent. The inverse topographical pattern (i.e., groves or trenches tha6t form imprint portions 503) can be formed at substantially lower temperatures and/or pressures by exploiting the photochemical conversion and curing of the imprint layer 304 with "step and flash" imprint lithography than with "thermal imprint" lithography.

Thermal imprint lithography and step and flash imprint lithography rely on different mechanisms to form the inverse topographical patterns in the imprint layer 304 based on the topographical patterns 512 formed in the imprint template 305. Any type of IL described in this disclosure can use thermal IL or step and flash IL. Thermal IL relies primarily on: a) heat applied to the imprint layer 304, and b) pressure applied from the imprint template 305 into the imprint layer 304 to shape the imprint layer.

To provide the imprinting process, the imprint template 305 having the inverse pattern of the features of interest is forced into imprint layer 304 and forms corresponding patterns (illustrated by the imprint portion 503 in FIGS. 8c and 8d) into the imprint layer 304. The imprint templates 305 can be formed using e-beam lithography that is applied only once for each master-imprint template 305. For imprinting, the imprint template 305 is typically pressed into the imprint layer 304 at some pressure and at moderately higher temperatures than room temperature.

Step and flash imprint lithography relies on light (e.g., ultraviolet light) transmitted through the imprint template 305 into the imprint layer. Applying light into such imprint layer materials as a polymer hardens or cures the polymer into its desired configuration. In step and flash imprint lithography, sufficient pressure is applied from the imprint template 305 into the imprint layer 304 to shape the material of the imprint layer prior to the application of the light. The light that is transmitted through the imprint template 305 into the imprint layer 304 is at a frequency (e.g., ultraviolet for certain imprint layer materials) that can modify (e.g. cross-link) the photoresist polymer materials forming the imprint layer. The imprint template 305 used in step and flash imprint lithography is thus light-transparent so light can be directed through the imprint template 305 into the material forming the imprint layer 304. In one embodiment, the imprint template 305 (used in step and flash imprint lithography) is made from quartz that can be etched using, for example, e-beam lithography. There is no requirement for thermal imprint lithography that the imprint template 305 be light transparent.

In thermal imprint lithography, the imprint template 305 is able to withstand the elevated temperatures required to soften the material forming the imprint layer 304 (and may be, for example, made from a semiconductor such as silicon or an oxide such as silicon dioxide). Performing step and flash imprint lithography at non-elevated temperatures can be useful for fabrication of multi-layered structures. Raising the temperature of an upper-most layer of a multi-layered structure to a temperature where it becomes deformable may also cause adjacent layers to reach a temperature where they are either deformable, or are close to being deformable. If the lower layers are near being deformable, then the pressures applied by the stamping of imprinting actions of imprint lithography to the upper layer (to form the grooves and trenches of the inverse topographical patterns) may act to deform buried features on the lower layers. As such, during thermal imprint lithography, the temperatures of the substrate and the imprint layers must be closely monitored. With step and flash imprint lithography, following curing, the lower layers are maintained at a temperature so that they will continue to be solid. In addition, step and flash imprint lithography does not require the time to heat up the material of the imprint layer, then cool down the material of the imprint layer, during cycles. As such, taller structures can be built using step and flash imprint lithography than in certain other lithographic techniques since the already deposited layers are not raised to temperatures for IL processing that is sufficient to distort previously deposited layers by, for example, melting.

For thermal imprint lithography, following the driving the imprint template 305 downward into the material of the imprint layer to form the inverse pattern from the imprint template 305 into the imprint layer deposited on the substrate, the material of the imprint layer is cooled to a temperature that it no longer has deformable characteristics. For step and flash imprint lithography, light is directed through the imprint template 305 until the imprint layer 304 is cured.

The imprint template 305 is then lifted out as shown in FIG. 5d leaving the inverse-impressions formed in the imprint layer 304 as illustrated. An inverse pattern of the imprint template 305 (forming the topography) is replicated in the material of the imprint layer 304. Following the lifting out of the imprint template 305, a reactive ion etch (RIE), oxygen plasma etch, or other type of etch can be used to clear out certain imprint layer residuals (e.g., residual polymer material) that may remain where the features of the imprint template 305 have been pressed into the imprint portion 503 formed in the imprint layer 304. The RIE process is illustrated in FIG. 8f and at 708 in FIGS. 9a and 9b.

If desired, a second imprint layer 304 (that acts as a passivation layer) may be redeposited within the imprint portions 503. During the deposition of such a repassivation layer, an electrical insulator (oxide, etc.) is deposited on top of the substrate using a blanket deposition process (such as sputtering, evaporation, CVD). Also silicon will form an oxide intrinsically, and may utilize known techniques of making the layer thicker.

Figure 8E:
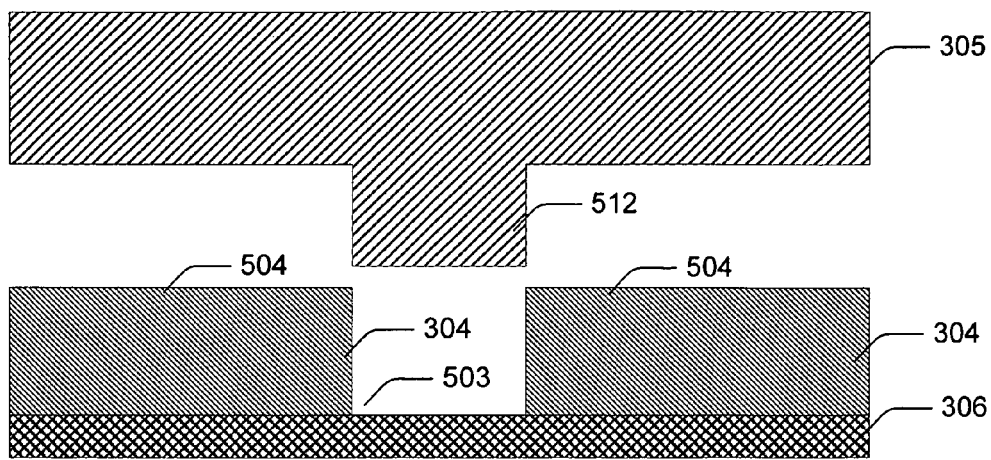
Figure 8F:
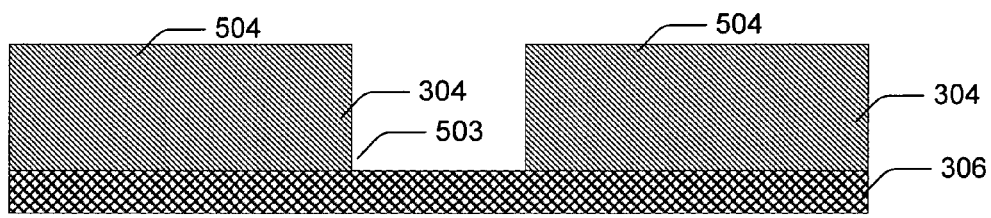

FIG. 8e illustrates the imprint layer 304 following an actual imprinting process. The regions of the imprint layer 304 that are stamped (i.e., in which the imprint portions 503 are formed) generally correspond to the regions of the active layer 302 that eventually form the superconductor electrode 202 and the associated electronic circuitry as shown in FIG. 8q as described below.

Figure 8G:
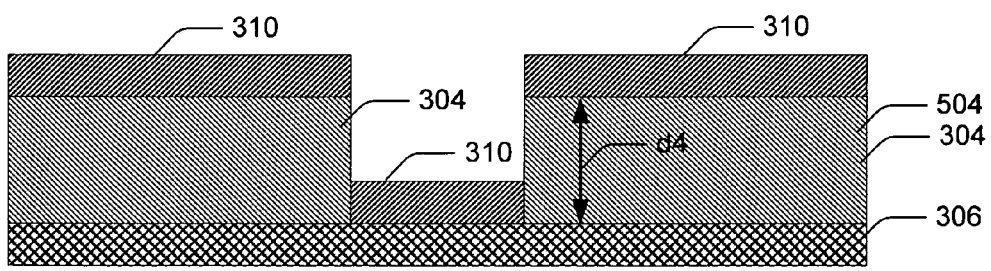

In FIG. 8g (also 709 in FIGS. 9a and 9b), one or more superconductor materials (e.g., a superconductor metal) are deposited as a superconductor layer 310 over the topography formed following 8f. The superconductor layer 310 can be deposited on/within in the imprint layer 304. Superconductor layer 310 is formed both in the trenches and on the top of the imprint layer 304. The superconductor layer 310 can be applied on the imprint layer 304 by such deposition processes as evaporation, sputtering, and/or chemical vapor deposition (CVD). In FIG. 8g, the superconductor layer 310 is deposited on the imprint layer 304 and in the impression portion of the imprint layer that followed the stamping/imprinting process shown in FIGS. 8c, 8d, and 8e. The superconductor layer 310 is deposited at a thickness that is less than the height of the profile of the imprint layer 304 (the depth d4 of the trenches) so the deposited superconductor layer 310 within the trenches does not form a continual structure with the superconductor layer 310 deposited above the imprint layer 304. If such a continual structure of superconductor material were formed, removal (e.g. by a lift-off process) of the superconductor layer 310 on the imprint layer 304 as shown in FIG. 8h would be made more difficult (if not impossible).

Depending on the aspect ratio of the impressions within the imprint layer 304, it is ensured that the height will allow the lift-off process to be used. Lift-off can only be used with greater than a prescribed height/aspect ratio.

Figure 8H:
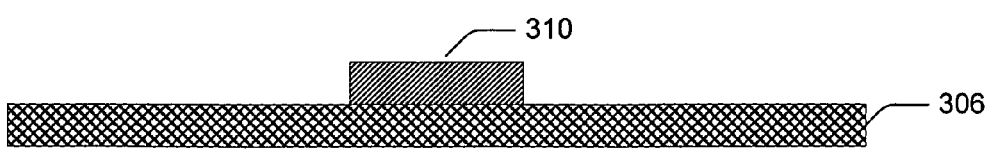

In FIG. 8h (and 710 in FIGS. 9a and 9b), the remaining imprint layer 304 and the portions of the superconductor layer 310 above the imprint layer 304 are "lifted off" to be separated from the active layer 302. To provide lift-off, the imprint layer 304 covered by the superconductor layer 310 is etched away using a chemical etching process (for example by soaking in acetone). Etching away those portions of the imprint layer 304 that are deposited under the superconductor layer allow the superconductor layer 310 over those portions of the imprint layer 304 to be lifted off.

Following the "lift-off" (of the remaining portions of the thin imprint layer 304) as shown in FIG. 8h, the superconductor layer 310 remaining on the substrate 306 forms the one of the superconductor electrodes 202 as illustrated in FIGS. 1, 2, and 3. When forming such superconductor devices as the Josephson junction 200 (as shown in FIGS. 1, 2, and 3), or the DC SQUID 400 (as shown in FIG. 4), the tunnel junction 208 as well as the top superconductor electrode 202 is formed on top of the substrate 306 and the bottom superconductor electrode 204. To complete fabrication of a superconductor device, the second one of the superconductor electrodes 204 is deposited in a manner described to FIG. 8q. In addition, a passivation insulator layer 311 is created between the superconductor electrodes 202 and 204 in a manner now described.

Figure 8I:
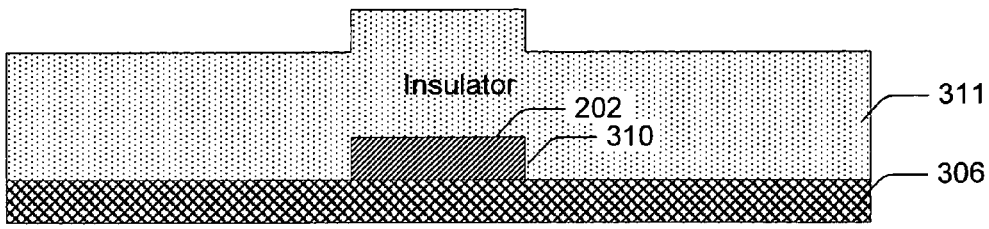
Figure 8J:
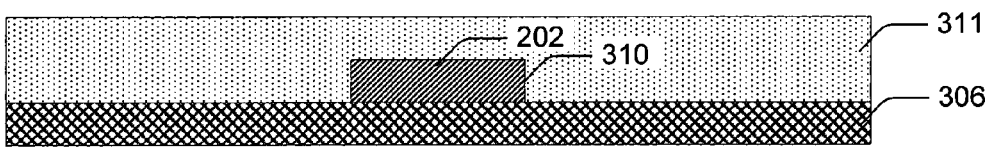

Following the above fabrication technique as illustrated in FIGS. 8a, 8b, 8c, 8d, 8e, 8f, 8g, and 8h, a passivation (oxide) insulator layer 311 is applied in FIG. 8i (and 712 in FIGS. 9a and 9b) in the form of a blanket electrical insulator layer that ultimately electrically insulates the two superconductor electrodes 202, 204. The blanket passivation insulator layer 311 can be, for example, silicon dioxide, silicon nitride, or polysilicon deposited over the entire array 700. It is important to apply a blanket electrical insulator layer to the top of the bottom superconductor electrode. This can be done using a standard CVD process or by sputtering an insulator. FIG. 8j (also 714 in FIGS. 9a and 9b), the passivation insulator layer 311 is planarized using chemical mechanical polishing (CMP) to remove any disparities on the surface in the passivation layer 311 above the superconductor electrode 202.

Figure 8K:
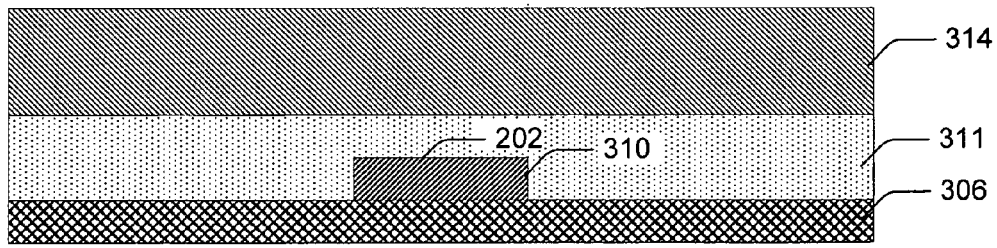

A second imprint layer 314 (that in one embodiment includes a polymer) is next deposited on the passivation oxide layer 311 as shown in FIG. 8k (also 716 in FIGS. 9a and 9b). The imprint layer 314 can then be imprinted using IL procedures to form the desired pattern, and in a similar manner to that applied to the imprint layer 304.

Figure 8L:
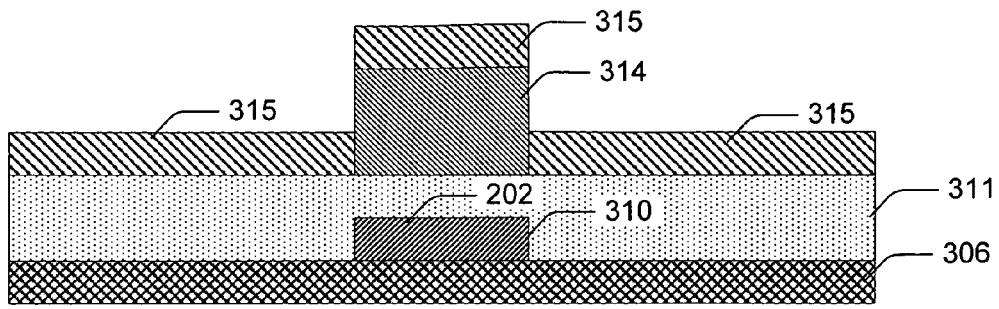
Figure 8M:
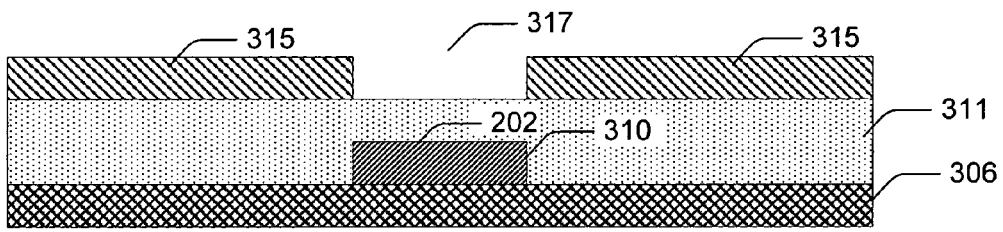

In one embodiment, the imprint layer 314 is imprinted (i.e., by stamping) as described in FIG. 8l and 718 in FIGS. 9a and 9b. Once the imprint layer 314 has been imprinted, a hard mask metal 315 is deposited on the imprint layer 314 as also shown in FIG. 8l. Certain portions of the hard mask metal 315 are deposited on the non-imprinted portions 504 of the hard mask imprint layer 314, and these portions can be lifted off as shown in FIG. 8m. Other portions of the hard mask metal 315 are deposited on the passivation insulator layer 311 that are within the imprinted (i.e. removed) portion of the imprint layer 314; and these portions form the final outline of the hard mask metal 315. The hard mask metal 315 creates a template to remove the passivation insulator layer, and thereby determines the location of the tunnel junction 208 as shown in FIGS. 1 to 3. Following the imprinting of the hard mask imprint layer 314 by the hard mask imprinting template, the pattern of the hard mask imprint layer 314 closely mirrors the pattern of the superconductor electrode 202 (taken in a horizontal plane). The pattern of the imprint layer 314 determines the location of the hard mask metal 315. The portion of the hard mask metal 315 that is deposited on the passivation insulator layer 311 has a reversed pattern (taken in the horizontal cross-sectional plane as shown in FIG. 8m) as the superconductor electrode 202.

Figure 8N:
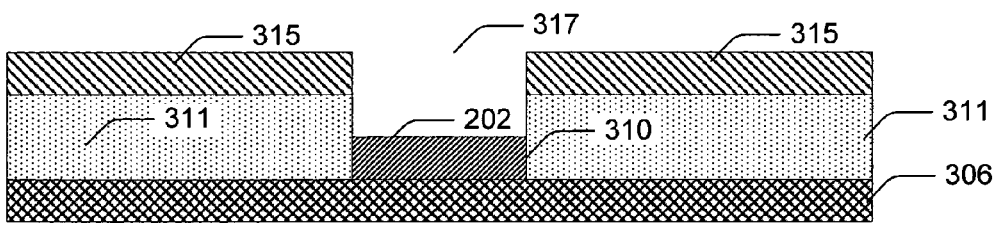

Following the formation of the hard mask metal 315, another dry etch, RIE etch, or chemical etch process is performed to remove small regions of the passivation insulator layer 311, and thereby expose a portion of the metal forming the superconductor electrode 202. This is shown in FIG. 8n and in 722 of FIGS. 9a and 9b. By exposing the metal of the first superconductor electrode 202, the bottom electrode metal is then oxidized for a very brief period of time using conventional oxidation processes (e.g., to convert niobium into $Nb_2O_5$) which functions as a tunnel layer.

To perform this hard mask process, as shown starting in FIG. 8l (and shown in 720 in FIGS. 9a and 9b), a hard mask metal 315 is deposited on the substrate above the passivation insulator layer 311 that is not covered by the hard mask imprint layer 314. The hard mask metal 315 is also deposited on those portions of the imprint layer 314 that remains deposited above the passivation insulator layer 311 following the imprinting/stamping process. In FIG. 8m (as shown in 722 in FIGS. 9a and 9b), the portions of the hard mask imprint layer 314 that remains deposited above the passivation insulator layer 311 (including those portions of the hard mask metal 315 deposited thereupon) are lifted off from the passivation insulator layer 311. Following FIG. 8m, the hard mask metal 315 will generally cover those areas of the passivation insulator layer 311 that are not vertically above (and spaced from) the superconductor electrode 202.

As shown in FIG. 8n (also 724 in FIGS. 9a and 9b), those portions of the passivation insulator layer 311 that are below openings 317 formed in the hard mask metal 315 are etched. This etching is performed down to the level of the superconductor electrode 202. As such, the superconductor electrode 202 will be substantially open to the atmosphere above the substrate 306.

Figure 8O:
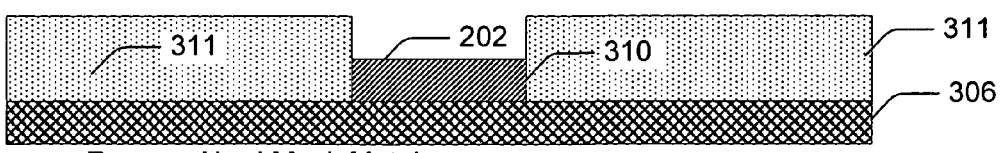

In FIG. 8o (also 726 in FIGS. 9a and 9b), all remaining portions of the hard mask metal 315 are etched from above the passivation insulator layer 311. This removes the remaining portions of the hard mask metal 315 leaving behind a recess in the passivation insulator layer 311 that exposes the tunnel junction 208 for further processing. As shown in FIG. 8o, the upper surface of the substrate 306 is covered by the passivation insulator layer 311 and the superconductor layer 310 forming the superconductor electrode 202.

Figure 8P:
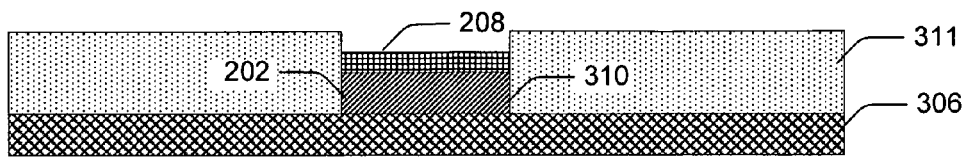
Figure 8Q:
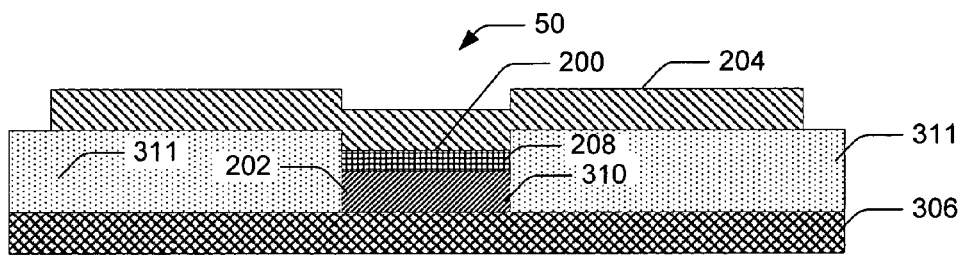

As shown in FIG. 8p (and 726 in FIGS. 9a and 9b), the tunnel junction 208 is formed by oxidizing the bottom superconductor electrode 202. As shown in FIG. 8q (and 728 in FIGS. 9a and 9b), the superconductor electrode 204 is deposited on the substrate using IL techniques. The superconductor electrode 204 is deposited on the substrate in a similar manner as the superconductor electrode 202 described relative to 709 and 710 in FIGS. 9a and 9b. The superconductor electrode 204 remains electrically insulated from the superconductor electrode 202 at all locations (in a similar manner as described relative to FIGS. 1, 2, and 3) except at the tunnel junction 208 in which a certain number of electrons can tunnel between the superconductor electrodes 202 and 204.

Considering the embodiments of superconductor device 50 shown in FIGS. 1, 2, and 3, the Josephson junction 200 can be formed by forming two superconductor electrodes 202, 204 having a thin metal oxide junction formed between. In one embodiment, niobium is used which is a good superconductor metal. A small region of the niobium is oxidized between the two electrodes to form a tunnel junction formed from niobium pentoxide. The oxidized region is either on the edge of the lower layer, or above one electrode and below the second electrode.

SQUIDs are among the most sensitive devices to measure magnetic fields. Magnetic fields thread flux lines through the superconductor loop 402 (into or out of the plane of the paper shown in FIG. 4 in the region shown as 410) and force an interference between the two Josephson junctions 200 of the DC SQUID. The quantum mechanical nature of this interference is the source of the DC SQUIDs 400 remarkable sensitivity to extremely small magnetic fields. It is this property that provides a mechanism for detecting minute magnetic fields produced by the brain and other portions of the body, or other magnetic field sources (naturally occurring or man made). DC SQUIDs 400, RF SQUIDs, and other superconductor devices including Josephson junctions are particularly suited for biological, physiological, and other applications where the levels of the generated magnetic fields are minute, and therefore have to be measured or detected by extremely sensitive devices. IL technique provides with the capability to efficiently fabricate a large quantity of such superconductor devices as the Josephson junctions, DC SQUIDs 400, and RF SQUIDs.

DC SQUIDs 400 and RF SQUIDs have found many applications relating to the sensing of magnetic flux. Dense arrays of the DC SQUIDs 400 and/or the RF SQUIDs make it possible to spatially map magnetic fields at high resolutions. Current e-beam lithography can fabricate superconductor devices with dimensions that are down to a few tens of nanometers. One embodiment of IL thereby utilizes imprint templates 305 (see FIG. 8c) produced by such techniques as e-beam lithography to produce parts that are virtually identical to these imprint templates 305. As such IL is also capable of producing superconductor parts having dimensions that are within the few-tens of nanometer scale.

The relative thermal expansions and flexibilities of the materials should be considered when using superconductors. Many materials will not be flexible even at 77 degrees kelvin, where the bulk of high temperature superconductors typically operate. In one embodiment, the device/sheet is shaped around the object being sensed (or to be sensed) prior to the device/sheet being cooled down.

In this disclosure, the use of IL methods are described in the fabrication of the arrays 700 of Josephson junctions 200 and SQUIDs. By exploiting the advantages of the IL process, it may be possible to manufacture dense, cross-bar arrays 700 of superconductor devices and circuits in a cost effective way. SQUIDs are used in a variety of applications such as biomedical diagnosis, nondestructive testing, magnetometry, gradiometry, susceptometry, gravity-wave antennas, and imaging. These applications will continue to press the limits of spatial resolution and will utilize macroscopic, mesoscopic, and ultimately nanoscopic device geometries and will use manufacturing and fabrication processes capable of producing these nano-scale, meso-scale, macro-scale, and mixed-scale device features. The fabrication methods discussed in this disclosure outline a low cost manufacturing approach, which may address these emerging applications.

Using imprint lithography as illustrated in FIGS. 8a, 8b, 8c, 8d, 8e, 8f, 8g, 8h, 8i, 8j, 8k, 8l, 8m, 8n, 8o, 8p, and 8q offers several advantages, including the ability to define and produce an array 700 of superconductor devices. Imprint lithography can produce nanostructures, mesostructures, and even macrostructures (that are orders of magnitude larger) simultaneously. Imprint lithography can perform the integration between superconductor devices having different sizes effectively and efficiently. Another important advantage of the simultaneous fabrication of nano-scale, meso-scale, macro-scale, and mixed-scale structures is that device performance may vary with size; such that the optimal size might vary between applications.

The use of semiconductor materials in the substrate may be desired to provide a superconductor circuit that includes semiconductor components (such as control and power supply components). The active layer 302 may also include implanted dopants applied using ion implantation. For those embodiments of superconducting circuits including semiconductor portions, a conductor or semiconductor active layer 302 can be provided.

One interest is the commercialization of portable, affordable brain function mapping and imaging diagnostic tools. By leveraging the features of imprint lithography it is possible to fabricate arrays of SQUIDs on low cost flexible substrates eliminating the need for expensive silicon substrates. Furthermore, by fabricating arrays of SQUIDs on conformal substrates, it is possible to more precisely shape the dense sensor arrays around the patient's head.

The operation of certain superconductor devices (such as Josephson junctions, superconductor transmission lines, and SQUIDs) improve as certain of their dimensions decrease. For instance, certain superconductor devices become more sensitive or more responsive. Repeatability and large production of such superconductor circuits and devices is allowed by IL processing. Detectors using Josephson junctions can accurately sense incrementally minute magnetic fields with high accuracy. Josephson junctions, superconductor transmission lines, and SQUIDs are pertinent to many medical, biological, and physiological applications. This disclosure describes a variety of dense arrays of SQUIDs (and the associated manufacture thereof) that utilize an image mapping technology to provide high resolution brain images. Arrays of SQUID-based arrays can also be used for other technologies that are based on the detection of minute magnetic fields produced by the brain or other body parts, such as magnetoencephalography technology.

Prior art superconductor devices such as Josephson junctions 200 and SQUIDs are fabricated using electron beam lithography, anodization, ploughing, and focused ion beam processes. These fabrication technologies are suited, intended, and designed for fabricating discrete superconductor devices one-by-one. For example, with traditional e-beam lithography, each superconductor device 50 is patterned and processed individually. For commercial quantities of circuits, however, reproducibility of circuits such as is provided by IL, as described in FIGS. 8a, 8b, 8c, 8d, 8e, 8f, 8g, 8h, 8i, 8j, 8k, 8l, 8m, 8n, 8o, 8p, and 8q in this disclosure, is important to repeatedly produce superconductor devices, circuits and arrays of desired and controllable quality.

FIG. 11 illustrates one embodiment of a controller or a computer 800 that can perform the two-level IL process 701 that creates the superconductor electrodes 202 on the wafer using the technique illustrated in FIGS. 8a, 8b, 8c, 8d, 8e, 8f, 8g, 8h, 8i, 8j, 8k, 8l, 8m, 8n, 8o, 8p, and 8q. A process portion or "fab" is illustrated as 802. The process portion 802 may include a variety of process chambers 811 that the wafer 306 is translated between (often using a robot mechanism 812) to process the wafer 306. The particulars of the processing often vary between different suppliers. Such processes as chemical vapor deposition, physical vapor deposition, and electro-chemical deposition are known for deposited and/or etching specific materials within the process portion 802.

The controller or the computer 800 comprises a central processing unit (CPU) 852, a memory 858, support circuits 856 and input/output (I/O) circuits 854. The CPU 852 is a general purpose computer which when programmed by executing software 859 contained in memory 858 becomes a specific purpose computer for controlling the hardware components of the processing portion 802. The memory 858 may comprise read only memory, random access memory, removable storage, a hard disk drive, or any form of digital memory device. The I/O circuits comprise well known displays for output of information and keyboards, mouse, track ball, or input of information that can allow for programming of the controller or computer 800 to determine the processes performed by the process portion 802 (including the associated robot action included in the process portion. The support circuits 856 are well known in the art and include circuits such as cache, clocks, power supplies, and the like.

The memory 858 contains control software that when executed by the CPU 852 enables the controller or the computer 800 that digitally controls the various components of the process portion 802. A detailed description of the process that is implemented by the control software is described with respect to FIG. 9a or 9b, as illustrated with respect to FIGS. 8a, 8b, 8c, 8d, 8e, 8f, 8g, 8h, 8i, 8j, 8k, 8l, 8m, 8n, 8o, 8p, and 8q. In another embodiment, the computer or controller 800 can be analog. For instance, application specific integrated circuits are capable of controlling processes such as occur within the process portion 802.

Although the invention is described in language specific to structural features and methodological steps, it is to be understood that the invention defined in the appended claims is not necessarily limited to the specific features or steps described. Rather, the specific features and steps disclosed represents preferred forms of implementing the claimed invention.

What is claimed is:

1. A method of building a superconductor device on a substrate, comprising:
   depositing an imprint layer on at least a portion of the substrate;
   imprinting the imprint layer to provide at least one imprinted recess in the imprint layer and a non-imprinted portion of the imprint layer that at least partially surrounds the imprinted recess in the imprint layer;
   depositing a first superconductor layer in at least a portion of the imprinted recess of the imprint layer;
   forming a tunnel junction at least partially in contact with the first superconductor layer; and
   depositing a second superconductor layer at least partially in contact with the tunnel junction, wherein at least a portion of the second superconductor layer extends beyond a portion of the imprinted recess of the imprint layer in which the first superconductor layer is deposited, wherein the first superconductor layer, the tunnel junction, and the second superconductor layer combine to form the superconductor device.

2. The method of claim 1, wherein the substrate includes a semiconductor.

3. The method of claim 1, wherein the substrate includes a plastic material.

4. The method of claim 1, wherein the substrate includes a glass.

5. The method of claim 1, wherein the substrate includes a metal film.

6. The method of claim 1, wherein the substrate includes a paper.

7. The method of claim 1, wherein the substrate includes a fabric.

8. The method of claim 1, wherein the substrate is formed from a flexible material, in which the material is flexible at least at room temperature.

9. The method of claim 8, wherein the substrate is flexible at superconducting temperature.

10. The method of claim 8, wherein the substrate includes a paper.

11. The method of claim 8, wherein the substrate includes a fabric.

12. The method of claim 8, wherein the substrate includes a polymer.

13. The method of claim 1, wherein the method uses a high temperature superconductor material.

14. The method of claim 1, wherein the method uses a low temperature superconductor material.

15. The method of claim 1, wherein the first superconductor layer includes a curve.

16. The method of claim 1, wherein the first superconductor layer includes a coil.

17. The method of claim 1, wherein the method produces a Josephson junction.

18. The method of claim 1, wherein the method produces a direct current (DC) superconductor quantum interference device (SQUID).

19. The method of claim 1, wherein the method produces a radio frequency (RF) SQUID.

20. The method of claim 1, wherein the method produces a qubit element.

21. The method of claim 1, wherein the method produces a magnetometer.

22. The method of claim 1, wherein the method produces a gradiometer.

23. The method of claim 1, wherein the method produces a susceptometer.

24. The method of claim 1, wherein the method produces a voltmeter.

25. The method of claim 1, wherein the method produces a radio-frequency amplifier.

26. The method of claim 1, wherein the method produces a gravity-wave antenna.

27. The method of claim 1, wherein the method produces an analog-to-digital converter.

28. The method of claim 1, wherein the method produces a multiplexer.

29. The method of claim 1, wherein the method produces a magnet.

30. The method of claim 1, wherein the method produces a hybrid device, consisting of superconductor and non-superconductor elements.

31. The method of claim 1, wherein the method produces an array of superconductor devices.

32. The method of claim 1, wherein the method produces a substantially one-dimensional array of superconductor devices.

33. The method of claim 32, wherein the method produces a substantially two-dimensional array of superconductor devices.

34. The method of claim 32, wherein the method produces a cross-bar array of superconductor devices.

35. The method of claim 1, wherein the method produces a portion of a quantum computer.

36. The method of claim 1, further comprising lifting-off the second superconductor layer from the non-imprinted portion of the imprint layer.

37. The method of claim 8, further comprising conforming the substrate to an object to be monitored.

38. The method of claim 37, further comprising testing the object.

39. The method of claim 37, wherein the object is a patient.

40. A method comprising:
forming a substrate from a flexible material;
depositing an imprint layer on at least a portion of the substrate;
imprinting the imprint layer to provide an imprinted recess within the imprint layer and a non-imprinted portion of the imprint layer that at feast partially surrounds the imprinted recess;
depositing a first superconductor layer in at least a portion of the imprinted region of the imprint layer;
forming a tunnel junction at least partially in contact with the first superconductor layer;
depositing a second superconductor layer at least partially in contact with the tunnel junction, wherein at least a portion of the second semiconductor layer extends above the non-imprinted portion of the imprint layer, wherein the first superconductor layer, the tunnel junction, and the second superconductor layer combine to form the superconductor device; and
lifting-off at least a portion of the superconductor device from at least a portion of the non-imprinted portion of the imprint layer to create the portion of the superconductor device that is separate from the substrate.

41. The method of claim 40, further comprising conforming the substrate to a subject to be monitored.

42. The method of claim 40, further comprising connecting electric control circuitry to the superconductor device.

43. The method of claim 40, further comprising controlling the superconductor device.

44. The method of claim 40, further comprising monitoring the subject with the superconductor device.

* * * * *

UNITED STATES PATENT AND TRADEMARK OFFICE
CERTIFICATE OF CORRECTION

PATENT NO. : 6,926,921 B2
APPLICATION NO. : 10/430125
DATED : August 9, 2005
INVENTOR(S) : Stasiak et al.

It is certified that error appears in the above-identified patent and that said Letters Patent is hereby corrected as shown below:

Col. 18 (line 32), delete "feast" and insert therefor --least--.

Signed and Sealed this

Fifth Day of December, 2006

JON W. DUDAS
*Director of the United States Patent and Trademark Office*